: US 8,415,245 B2
(45) Date of Patent: Apr. 9, 2013

(54) METHOD OF MANUFACTURING SEMICONDUCTOR DEVICE AND SEMICONDUCTOR DEVICE

(75) Inventors: Yasuki Takata, Kawasaki (JP); Kaori Sumitomo, Kawasaki (JP); Hiroshi Horibe, Kawasaki (JP); Hideyuki Arakawa, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 281 days.

(21) Appl. No.: 12/878,228

(22) Filed: Sep. 9, 2010

(65) Prior Publication Data

US 2011/0057299 A1    Mar. 10, 2011

(30) Foreign Application Priority Data

Sep. 9, 2009   (JP) .................................. 2009-207952
May 31, 2010   (JP) .................................. 2010-124207

(51) Int. Cl.
   *H01L 21/44*   (2006.01)

(52) U.S. Cl.
   USPC ............ 438/617; 438/123; 257/784; 257/666

(58) Field of Classification Search .................. 438/111, 438/123, 617, FOR. 278; 257/666, 784, 257/786
See application file for complete search history.

(56) References Cited

U.S. PATENT DOCUMENTS

| 8,196,803 | B2 * | 6/2012 | Akiyama et al. | 228/180.5 |
| 2006/0011710 | A1 * | 1/2006 | Lee et al. | 228/180.5 |
| 2007/0029367 | A1 * | 2/2007 | Mii | 228/101 |
| 2007/0199974 | A1 * | 8/2007 | Babinetz et al. | 228/32 |
| 2008/0116548 | A1 * | 5/2008 | Li et al. | 257/676 |
| 2010/0148369 | A1 * | 6/2010 | Mii et al. | 257/773 |
| 2010/0248470 | A1 * | 9/2010 | Mii et al. | 438/617 |

FOREIGN PATENT DOCUMENTS

JP    2000-091372    3/2000

\* cited by examiner

*Primary Examiner* — S. V. Clark
(74) *Attorney, Agent, or Firm* — McDermott Will & Emery LLP

(57) ABSTRACT

Height control of a capillary is performed in a stitch bonding (2nd bond) in a wire bonding, so that a thickness of a stitch portion can be controlled, thereby ensuring a bonding strength at the stitch portion and achieving an improvement in a bonding reliability. Also, the stitch portion has a thick portion, and a wire and a part ($\alpha$ portion) of a bonding region of an inner lead is formed to a lower portion of the thick portion, thereby sufficiently ensuring a thickness of the stitch portion and a bonding region.

18 Claims, 22 Drawing Sheets

| SHAPE | STITCH PORTION 20 (COMPARATIVE EXAMPLE) | STITCH PORTION 5a |
|---|---|---|
| max (maximum) | 8.3 | 18.6 |
| ave (average) | 6.1 | 15.63 |
| min (minimum) | 3.8 | 9.4 |

METHOD OF MANUFACTURING SEMICONDUCTOR DEVICE AND SEMICONDUCTOR DEVICE

CROSS-REFERENCE TO RELATED APPLICATION

The present application claims priorities from Japanese Patent Application No. 2009-207952 filed on Sep. 9, 2009, and Japanese Patent Application No. 2010-124207 filed on May 31, 2010, the contents of which are hereby incorporated by reference into this application.

TECHNICAL FIELD OF THE INVENTION

The present invention relates to a manufacturing technology of a semiconductor device and a semiconductor device. More particularly, the present invention relates to a technique effectively applied to an improvement of bonding strength of wires in a wire-bonding process.

BACKGROUND OF THE INVENTION

Regarding wire bonding, there is a technique of, upon wedge bonding of wires on surfaces of leads, using a capillary having: a first pressing-down surface in a curved surface shape formed around an edge at a tip; and a second pressing-down surface formed in circle around the first pressing-down surface, and forming a flattened portion to the capillary by further increasing the pressing down amount so that bonding force to the surfaces of leads is strengthened. The technique is described in, for example, Japanese Patent Application Laid-Open Publication No. 2000-091372 (Patent Document 1).

SUMMARY OF THE INVENTION

Regarding wire bonding for electrically connecting electrode pads of a semiconductor chip and inner leads of a lead frame by wires made of a metal, gold has been mainly used as the material of the wires. However, due to recent price increase of gold, any substituting material of gold has been desired and copper is known as a material for wires cheaper than gold.

Reasons for using copper wires in wire bonding are not only cost reduction but also its excellent electric characteristics including a higher electric conductivity than gold wires.

In stitch bonding which is a bonding on the lead side (2nd side) of wire bonding, bonding is performed by temperature, load, ultrasonic wave, etc. Upon the stitch bonding, as illustrated in a comparative example of FIG. 16, a stitch bonding is complemented by applying a mechanical amplitude operation S together with bonding.

The inventors of the present invention have been made a study on the stitch bonding.

In the stitch bonding, after the wire is landed on the lead, only load application (this operation will be also called load control hereinafter) to the wire at the place is performed. That is, in the stitch bonding, after the wire is landed on the lead by a guide by a capillary, the capillary stays at the place and performs bonding by applying predetermined load and an ultrasonic wave, which are previously set, to the wire.

Therefore, when the wire is made of a soft material like gold, a bonding margin in the stitch bonding can be large and the bonding strength can be sufficiently ensured, but there is a problem of a high cost.

Meanwhile, when using copper wires, since copper wires are easier to get oxidized than gold wires, an oxide layer on the surface should be broken and thus it is necessary to apply relatively large load and/or ultrasonic waves to the copper wire. Further, copper wires made of a material harder than gold wires have a weaker bonding force than gold wires and originally have a small bonding margin. Therefore, to obtain a sufficient bonding strength, relatively large load and/or ultrasonic waves and the mechanical amplitude operation S are applied, as illustrated in FIG. 16, a thickness of a stitch portion 20 becomes too thin, and it results in a problem of wire cutting.

Note that above-mentioned Patent Document 1 does not describe about height control (thickness control) of wires at wire-bonding portions during stitch bonding, and thus height control of wires at wire bonding portions cannot be performed during stitch bonding even when the wire-bonding technology described in Patent Document 1 is used.

The present invention has been made in view of the above-mentioned problems, and a preferred aim of the present invention is to provide a technology capable of ensuring bonding strength of stitch bonding and improving bonding reliability of the stitch bonding.

Also, another preferred aim of the present invention is to provide a technology capable of reducing a cost of wire boning.

The above and other preferred aims and novel characteristics of the present invention will be apparent from the descriptions of the present specification and the accompanying drawings.

The typical ones of the inventions disclosed in the present application will be briefly described as follows.

A method of manufacturing a semiconductor device according to a typical embodiment includes the steps of: (a) preparing a lead frame including a chip mounting portion to which a semiconductor chip is mounted and a plurality of leads arranged around the chip mounting portion; (b) mounting the semiconductor chip to the chip mounting portion of the lead frame; and (c) connecting an electrode pad of the semiconductor chip and the lead corresponding to the electrode pad by a wire in accordance with a guide by a capillary, wherein the step (c) includes a height control step of controlling a height of the capillary so that the capillary presses the wire in a stepwise fashion from a first point where the wire contacts the lead to a second point where the capillary contacts the lead when connecting the wire to the lead.

In addition, another method of manufacturing a semiconductor device according to a typical embodiment includes the steps of: (a) preparing a wiring board including a chip mounting portion to which a semiconductor chip is mounted and a plurality of bonding leads arranged around the chip mounting portion; (b) mounting the semiconductor chip to the chip mounting portion of the wiring board; and (c) connecting an electrode pad of the semiconductor chip and the bonding lead corresponding to the electrode pad by a wire in accordance with a guide by a capillary, wherein the step (c) includes a height control step of controlling a height of the capillary so that the capillary presses the wire in a stepwise fashion from a first point where the wire contacts the bonding lead to a second point where the capillary contacts the bonding lead when connecting the wire to the lead.

Further, another method of manufacturing a semiconductor device according to a typical embodiment includes the steps of: (a) preparing a lead frame including a chip mounting portion to which a semiconductor chip is mounted and a plurality of bonding leads arranged around a periphery of the chip mounting portion; (b) mounting the semiconductor chip to the chip mounting portion of the lead frame; and (c) connecting an electrode pad of the semiconductor chip and the lead corresponding to the electrode pad by a wire in accordance with a guide by a capillary, wherein the step (c) includes: a height control step of controlling a height of the capillary so that the capillary presses the wire in a stepwise fashion from a first point where the wire contacts the lead to a second point where the capillary contacts the lead when connecting the wire to the lead; and a load-control step of applying load to the wire from the capillary after the height control step, and wherein a first ultrasonic wave is applied to the wire in the height control step, and a second ultrasonic wave larger than the first ultrasonic wave is applied to the wire in the load-control step.

A semiconductor device of a typical embodiment is a semiconductor device assembled by performing a wire bonding using a capillary, the semiconductor device including: a chip mounting portion to which a semiconductor chip is mounted; a plurality of leads arranged around the chip mounting portion; and a plurality of wires which electrically connect a plurality of electrode pads formed on the semiconductor chip and the plurality of leads corresponding to the plurality of electrode pads, respectively, wherein each of wire-bonding portions of the plurality of wires and the plurality of leads has a thick portion having a thickness larger than a height of a crossing point of extended lines of a face surface and a neck side surface of the capillary in a vertical direction, and a bonding region of the wire and the lead is formed at a lower portion of the thick portion.

Moreover, another semiconductor device according to a typical embodiment is a semiconductor device assembled by performing a wire bonding using a capillary, the semiconductor device includes: a chip mounting portion to which a semiconductor chip is mounted; a plurality of leads arranged around a periphery of the chip mounting portion; and a plurality of wires which electrically connect plurality of electrode pads formed to the semiconductor chip and the plurality of leads corresponding the plurality of electrode pads, respectively, wherein each of wire bonding portions of the plurality of wires and the plurality of leads has a first bond region formed by applying a first ultrasonic wave having first amplitude and a second bond region formed by applying a second ultrasonic wave having second amplitude which is larger than the first amplitude.

The effects obtained by typical aspects of the present invention will be briefly described below.

It is possible to ensure a sufficient bonding strength in a stitch bonding in a wire bonding and improve a bonding reliability of the stitch bonding.

As it is possible to use copper wirings in a wire bonding, it is possible to reduce a cost of the wire bonding.

BRIEF DESCRIPTIONS OF THE DRAWINGS

DESCRIPTIONS OF THE PREFERRED EMBODIMENTS

In principle, in the descriptions of the embodiments hereinafter, identical or similar components will not be repetitively described unless otherwise needed.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Also, in the embodiments described below, meanings of "comprising A," "formed of A," "having A," and "including A" do not eliminate other elements than mentioned ones unless otherwise clearly state that the element is particularly limited to mentioned one. Similarly, in the embodiments described below, when the shape of the components, positional relation thereof, and the like are mentioned, the substantially approximate or similar shapes and the like are included therein unless otherwise stated or except the case where it is conceivable that they are apparently excluded in principle. The same goes for the numerical value and the range mentioned above.

Hereinafter, embodiments of the present invention will be described in detail with reference to the accompanying drawings. Also, components having the same function are denoted by the same reference symbols throughout the drawings for describing the embodiments, and the repetitive description thereof is omitted.

First Embodiment

Figure 1:
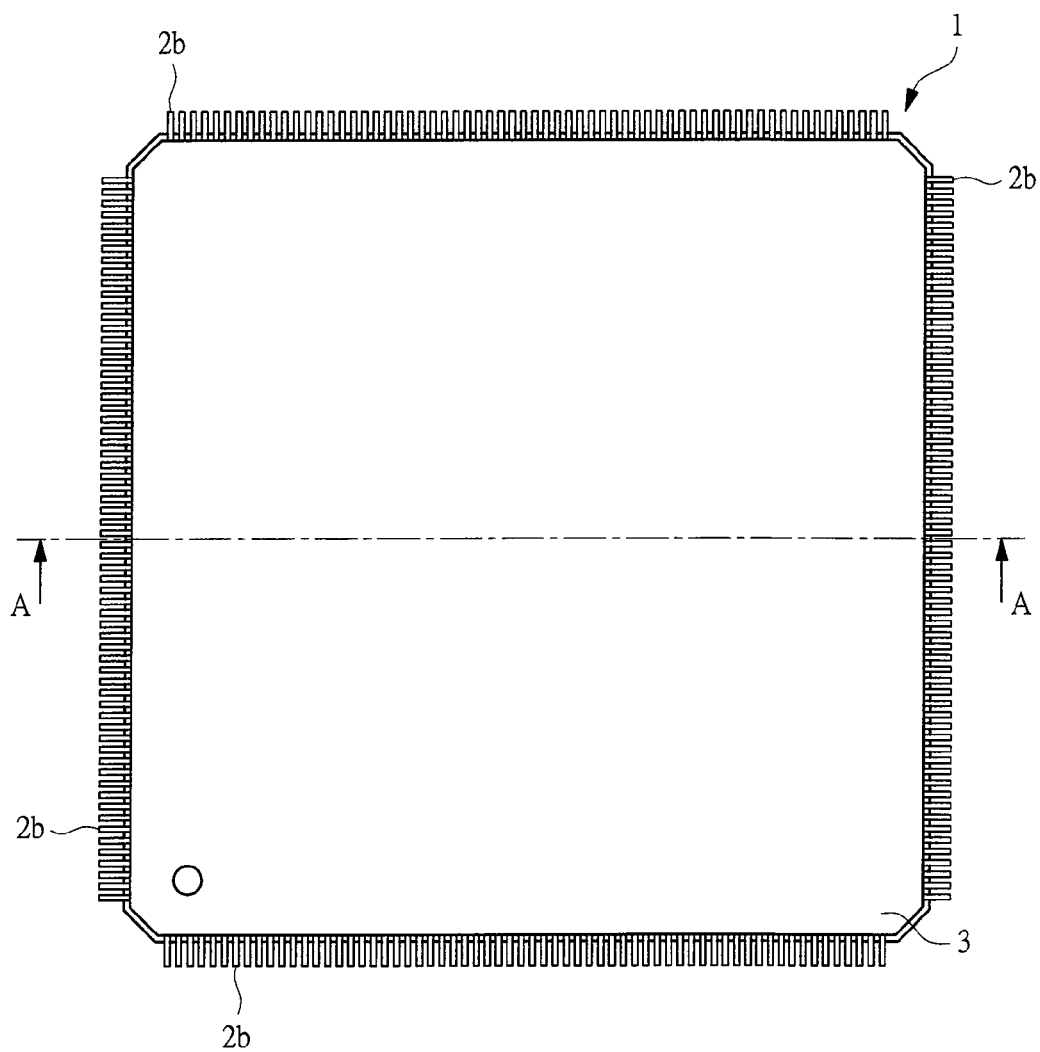
FIG. 1 is a plan view illustrating an example of a structure of a semiconductor device according to a first embodiment of the present invention.
Figure 2:
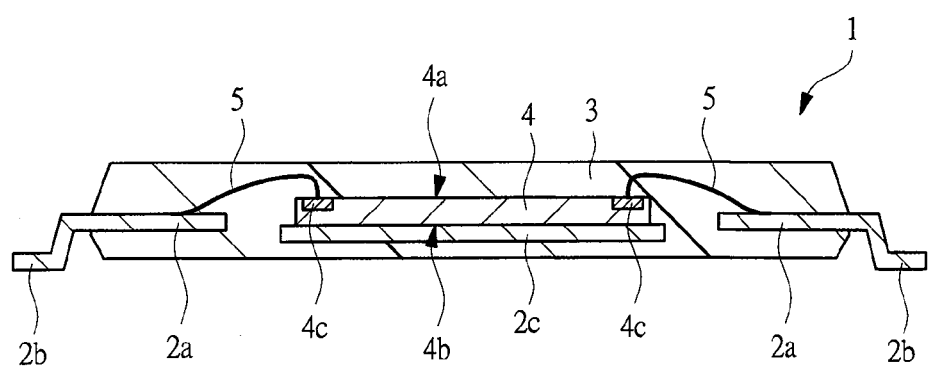
FIG. 2 is a cross-sectional view illustrating the structure illustrated in FIG. 1 cut along the line A-A of FIG. 1.

FIG. 1 is a plan view illustrating an example of a structure of a semiconductor device according to a first embodiment of the present invention, and FIG. 2 is a cross-sectional view illustrating the structure illustrated in FIG. 1 cut along the line A-A of FIG. 1.

The semiconductor device of the first embodiment is assembled using a lead frame and is a semiconductor package of high pin-count and resin-molded type. A high-pin-count QFP (quad flat package) 1 as illustrated in FIG. 1 is picked up and will be described as an example of the semiconductor device in the first embodiment.

A configuration of the QFP 1 illustrated in FIGS. 1 and 2 includes: a semiconductor chip 4 to which a semiconductor integrated circuit is formed; a plurality of inner leads (leads) 2a radially arranged around the semiconductor chip 4; a plurality of outer leads 2b integrally formed with the inner leads 2a; and wires 5 which electrically connect electrode pads 4c that are surface electrodes formed to a main surface 4a of the semiconductor chip 4 and the inner leads 2a corresponding to the electrode pads 4.

Further, the QFP 1 includes: a tab (also called "die pad") which is a chip mounting portion to which the semiconductor chip 4 is fixed via die bonding of a silver paste or the like; and a sealant 3 formed of a sealing resin or the like by resin molding and sealing the semiconductor chip 4, the tab 2c, the plurality of wires 5, and the plurality of inner leads 2a. Since the QFP 1 is a quad flat package, the plurality of lead 2b which are integrally formed with the plurality of inner leads 2a are protruded towards outside from each of the four sides of the sealant 3, and each of the outer leads 2b is bended and formed in a gull-wing shape.

Here, the semiconductor chip 4 mounted on the QFP 1 has the plurality of electrode pads 4c, which are formed to the main surface 4a, being provided at a narrow pad pitch, so that a high pin count is achieved.

In addition, the plurality of wires 5 electrically connecting the plurality of electrode pads 4c of the semiconductor chip 4 and the plurality of inner leads 2a corresponding to the electrode pads 4c, respectively, are copper lines formed of copper. That is, the QFP 1 of the first embodiment uses copper lines for the wires 5 to achieve a cost reduction.

Further, the QFP 1 is assembled with height control of bonding portions of the wires 5 (thickness control of stitch portions 5a (see FIG. 15)) during stitch bonding (during 2nd bond) in wire bonding in the assembly.

Figure 15:
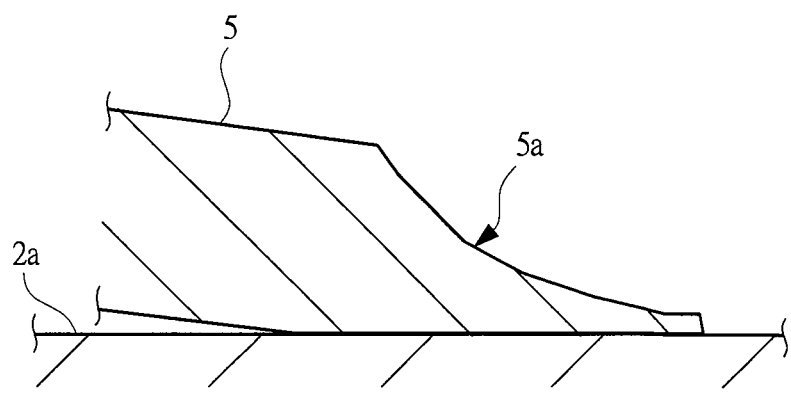
FIG. 15 is an enlarged partial cross-sectional view illustrating an example of a stitch shape when performing the stitch bonding by the wire bonder illustrated in FIG. 7.

That is, a bonding strength of the copper wires (wires 5) is sufficiently ensured by performing control of a thickness of the stitch portion 5a of the wire 5 as illustrated in FIG. 15 during wire bonding between the wires 5 and the inner leads 2a.

Note that the inner leads 2a, outer leads 2b, and tab 2c are formed of, for example, thin-plate shape members of copper alloy or the like, and further, the sealant 3 is formed of, for example, a thermosetting epoxy-based resin and formed by resin molding.

Next, a method of manufacturing the semiconductor device (QFP 1) according to the first embodiment will be described along with the flow chart illustrated in FIG. 3.

Figure 3:
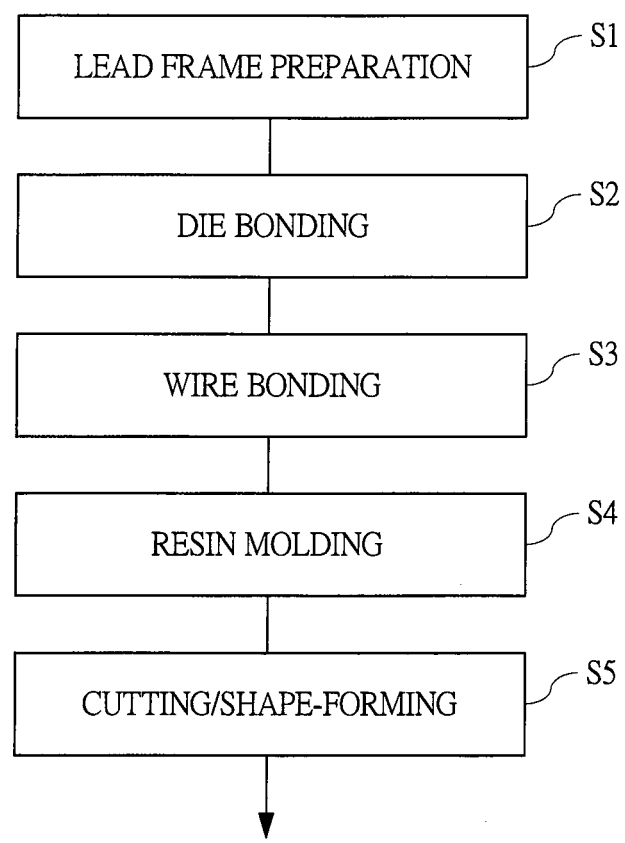
FIG. 3 is a manufacturing flowchart illustrating an example of an assembly procedure of the semiconductor device illustrated in FIG. 1.
Figure 4:
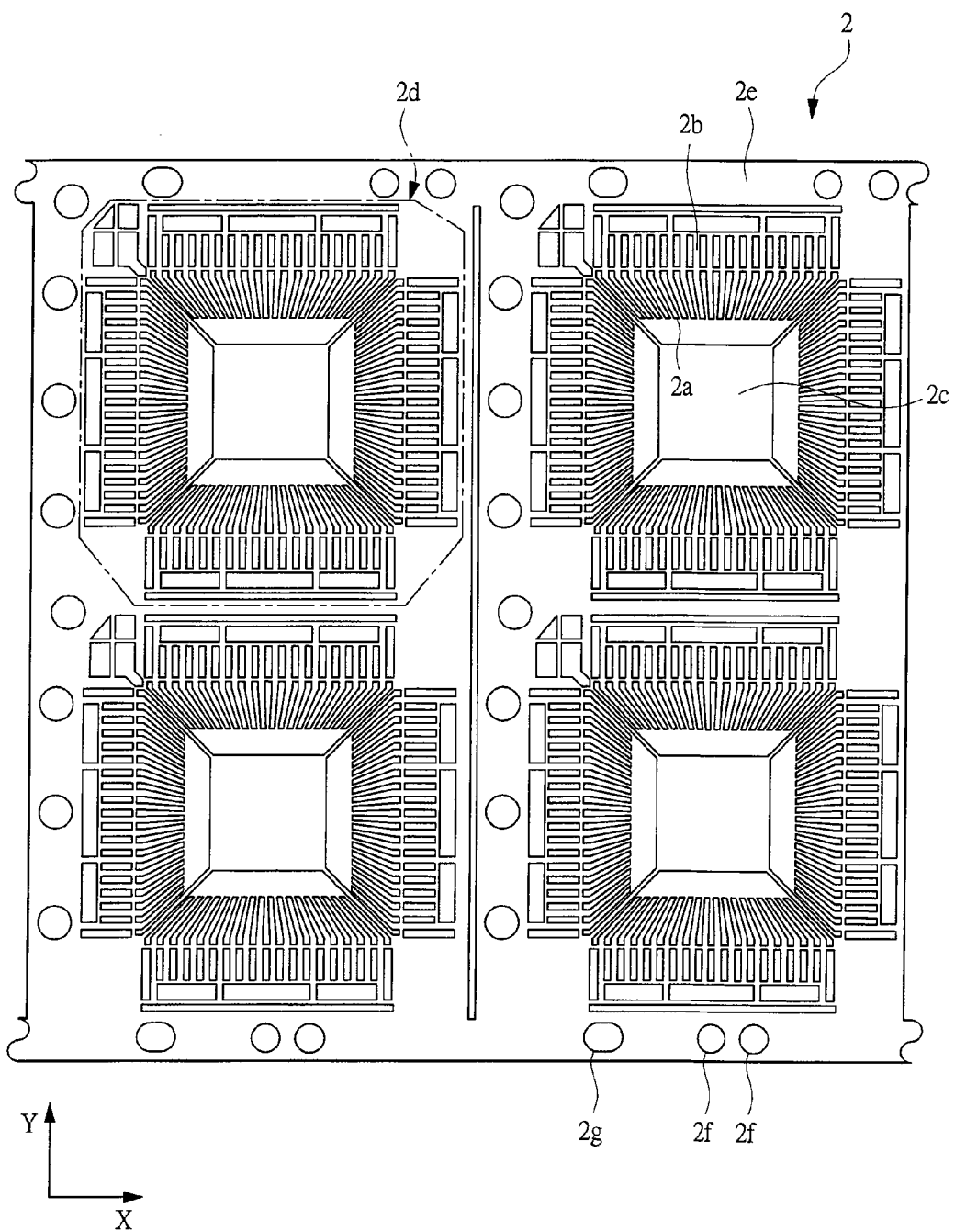
FIG. 4 is an enlarged partial plan view illustrating an example of a structure of a lead frame used in the assembly of the semiconductor device illustrated in FIG. 1.
Figure 5:
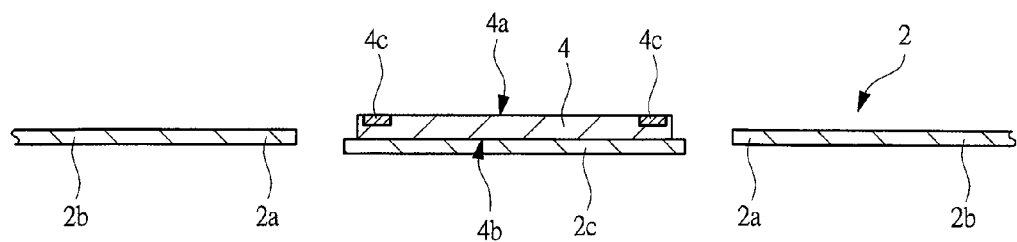
FIG. 5 is a partial cross-sectional view illustrating an example of a structure after a die bonding in the assembly of the semiconductor device illustrated in FIG. 1.
Figure 6:
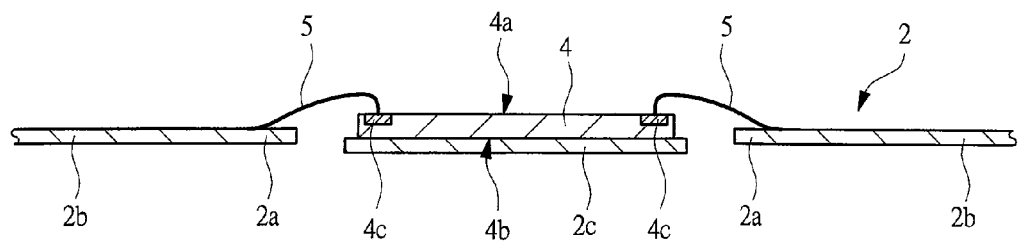
FIG. 6 is a partial cross-sectional view illustrating an example of a structure after a wire bonding of the assembly of the semiconductor device illustrated in FIG. 1.
Figure 7:
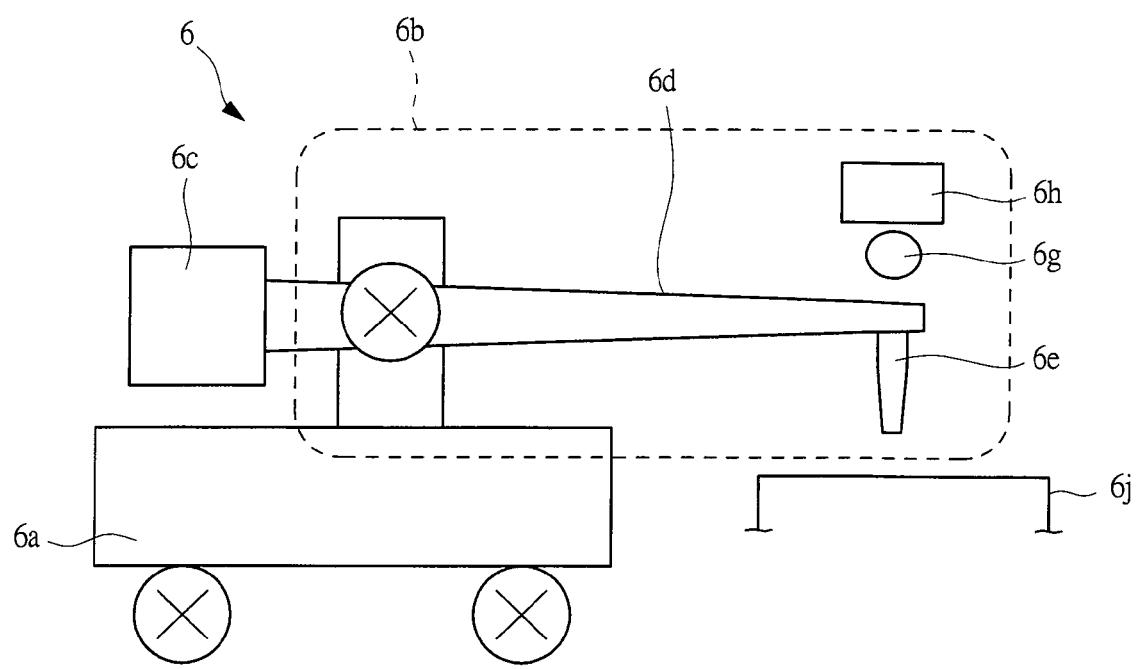
FIG. 7 is a configuration block diagram illustrating an example of a structure of a main part of a wire bonder used in a wire bonding process of the assembly of the semiconductor device illustrated in FIG. 1.
Figure 8:
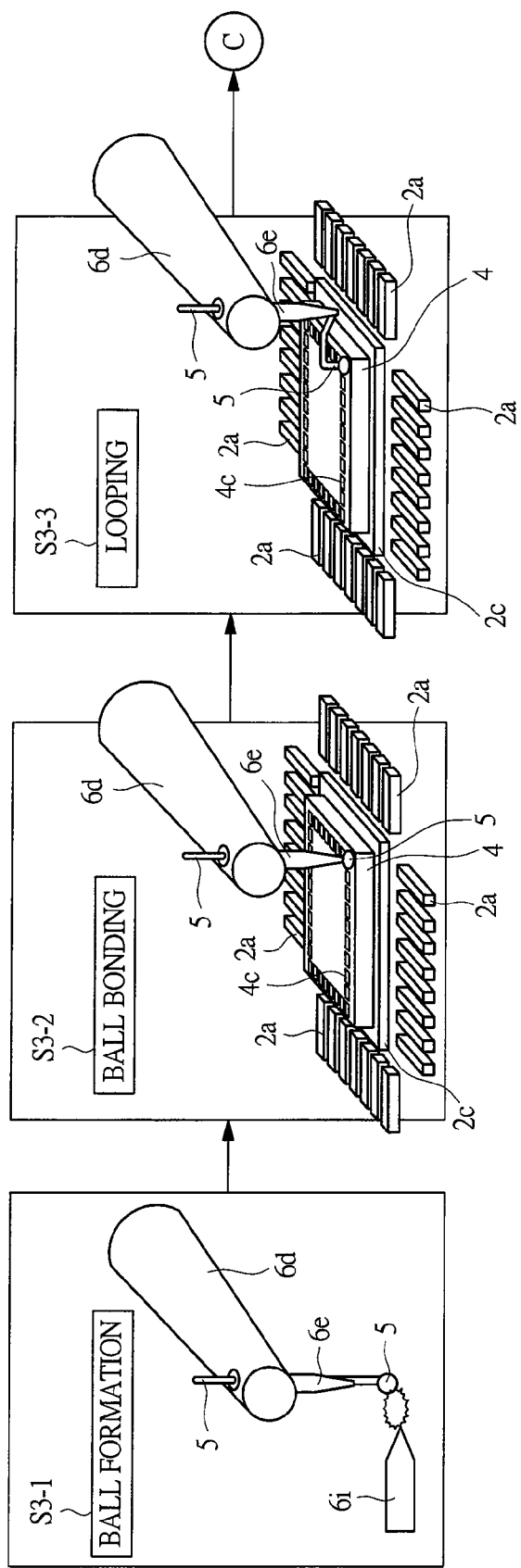
FIG. 8 is a perspective view illustrating an example of a procedure until a looping in the wire bonding using the wire bonder illustrated in FIG. 7.
Figure 9:
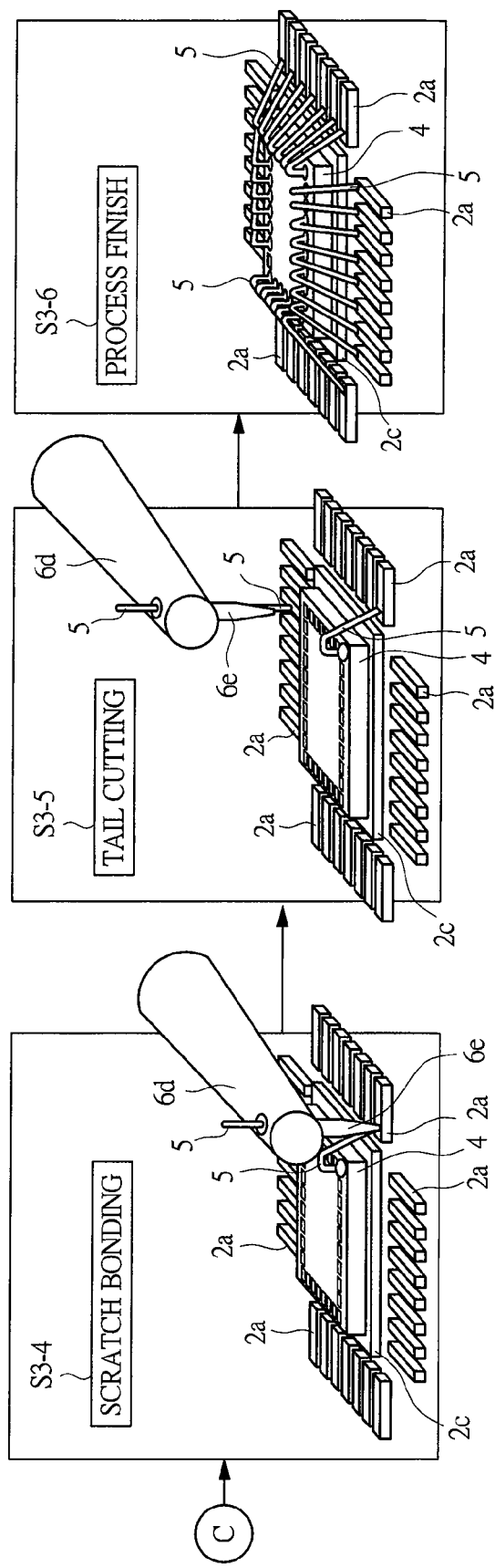
FIG. 9 is a perspective view illustrating an example of a procedure after a stitch bonding in the wire bonding using the wire bonder illustrated in FIG. 7.
Figure 10:
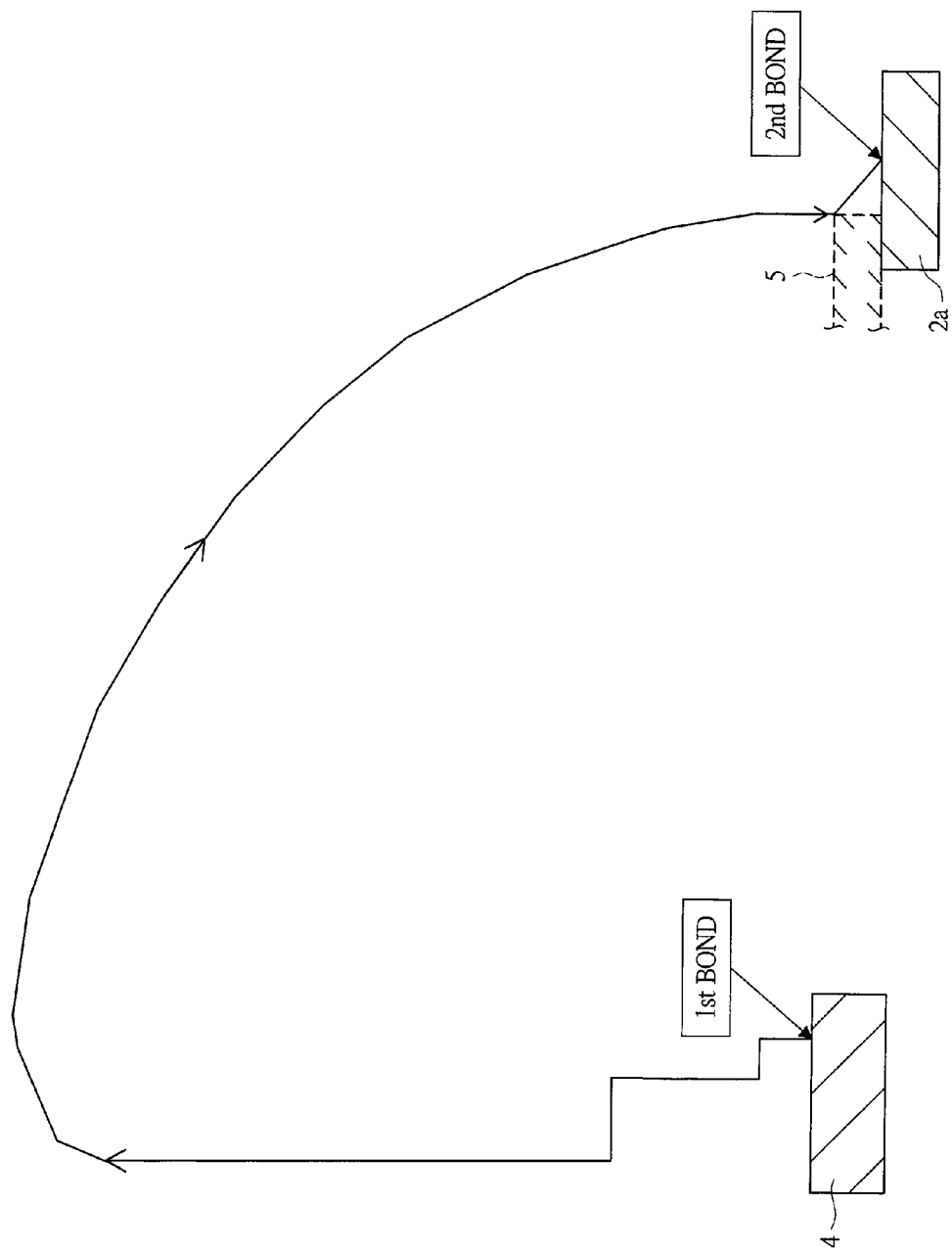
FIG. 10 is an operational diagram illustrating an example of a trajectory of a capillary from a first bond to a second bond in the wire bonding using the wire bonder illustrated in FIG. 7.
Figure 11:
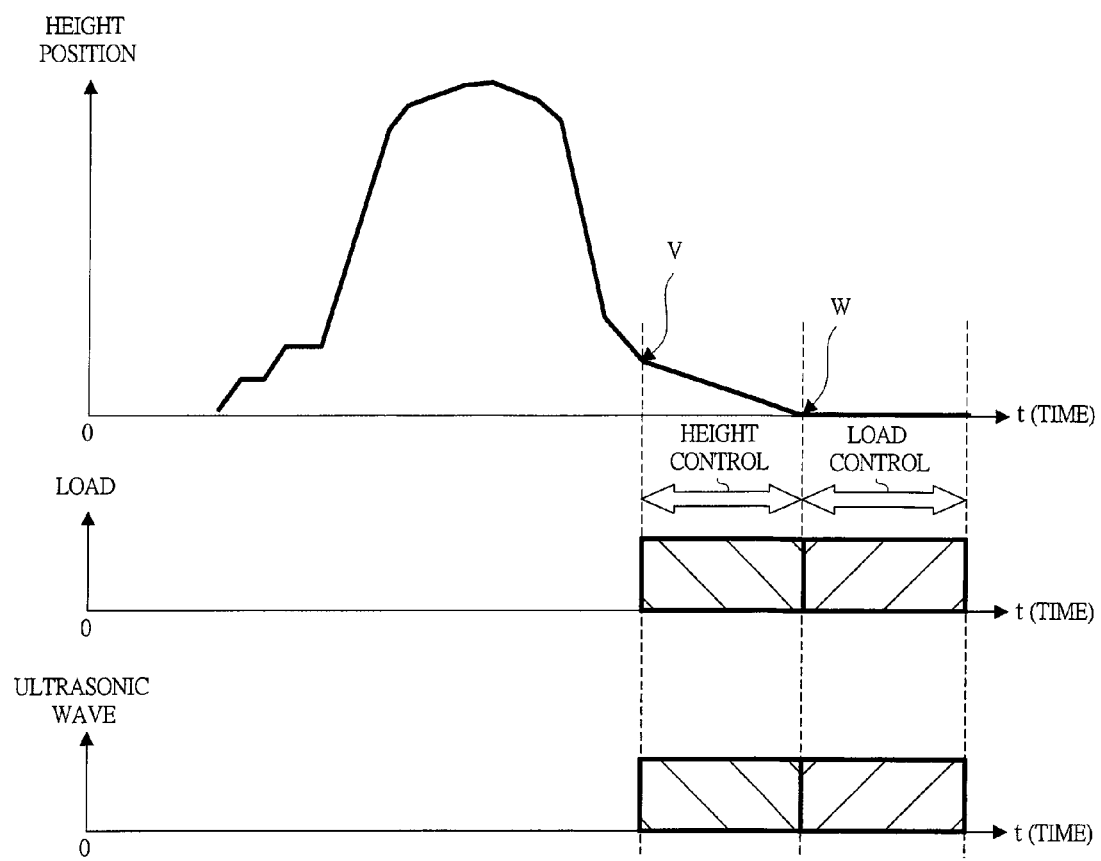
FIG. 11 is a control diagram illustrating an example of a control state of a height position of the capillary, load, and an ultrasonic waves in the wire bonding by the wire bonder illustrated in FIG. 7.
Figure 12:
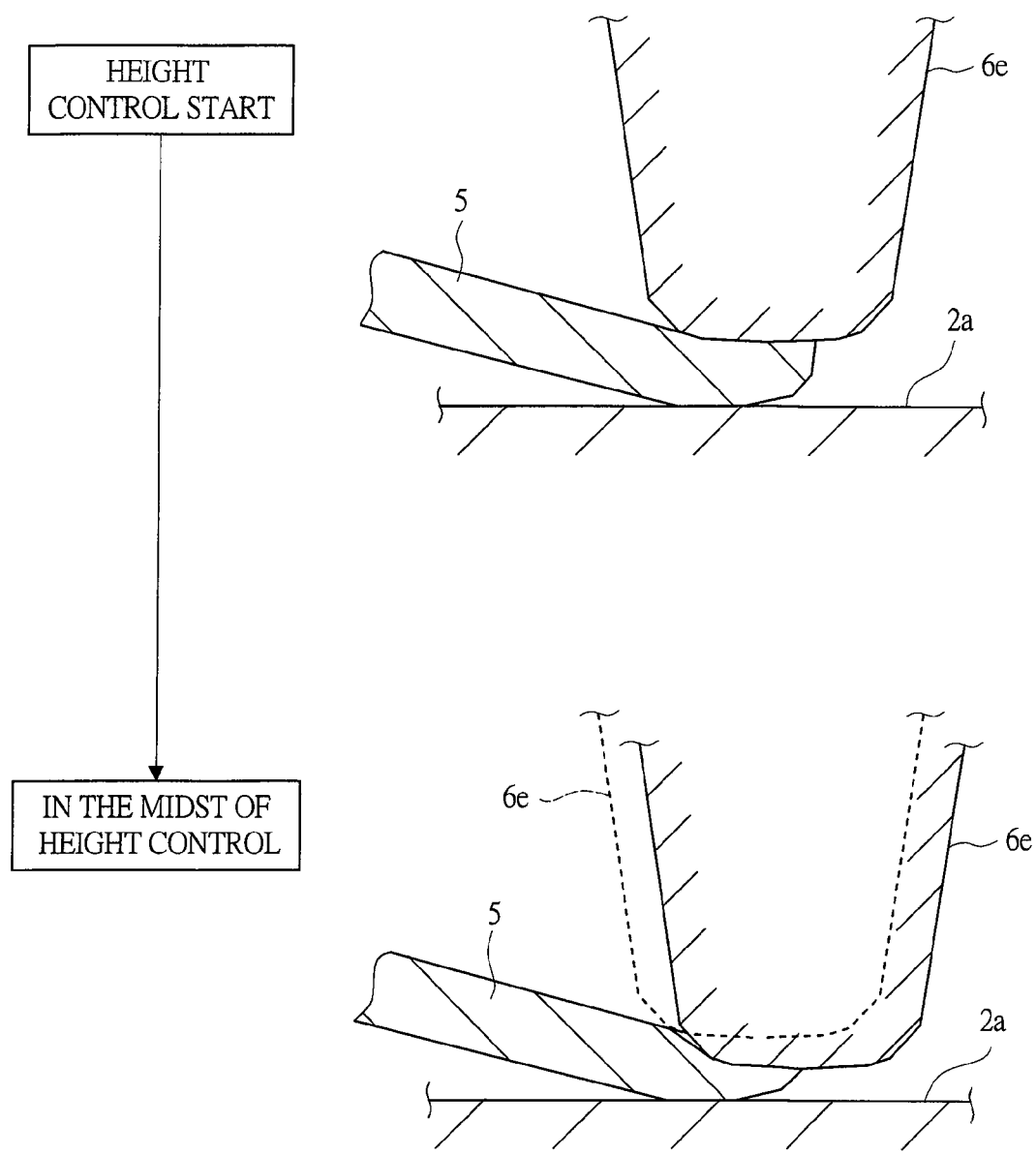
FIG. 12 is an enlarged partial cross-sectional view illustrating an example of a structure upon a landing detection and height control during the stitch bonding by the wire bonder illustrated in FIG. 7.
Figure 13:
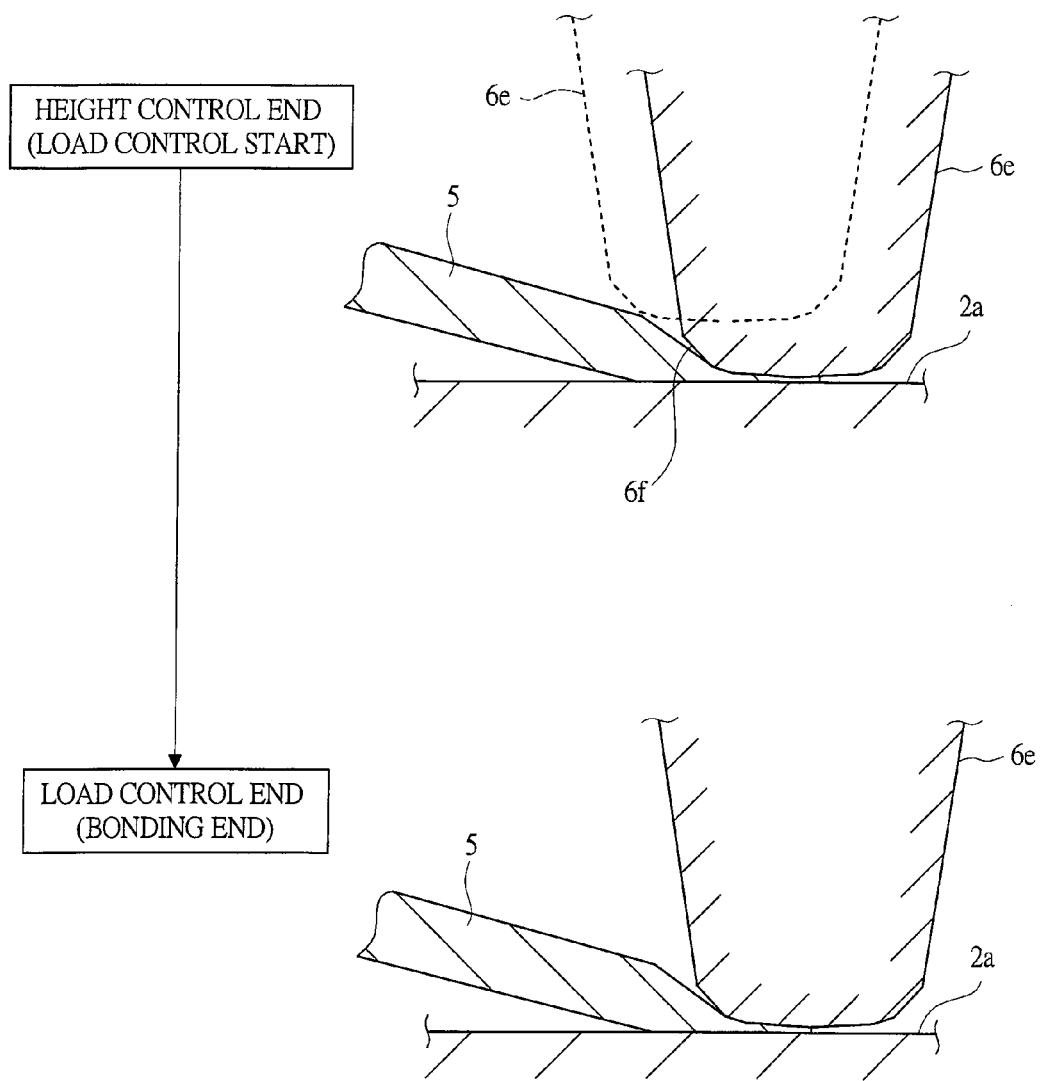
FIG. 13 is an enlarged partial cross-sectional view illustrating an example of a structure upon starting load control and ending the load control during the stitch bonding by the wire bonder illustrated in FIG. 7.
Figure 14:
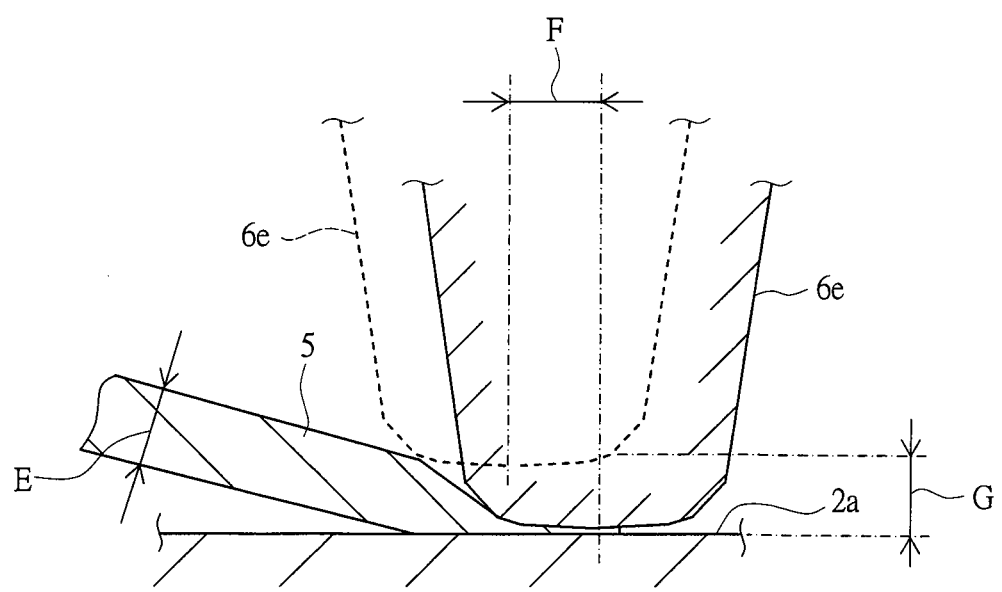
FIG. 14 is an enlarged partial cross-sectional view illustrating an example of a shift amount of an ideal capillary during the stitch bonding by the wire bonder illustrated in FIG. 7.
Figure 16:
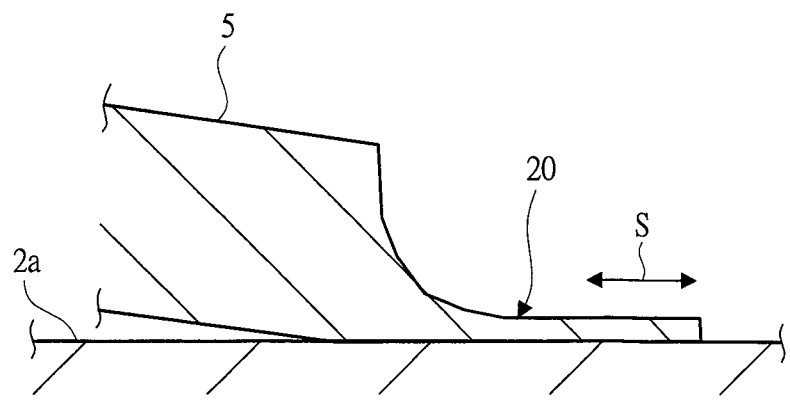
FIG. 16 is an enlarged partial cross-sectional view illustrating a stitch shape of a comparative example.
Figures 17, 18:
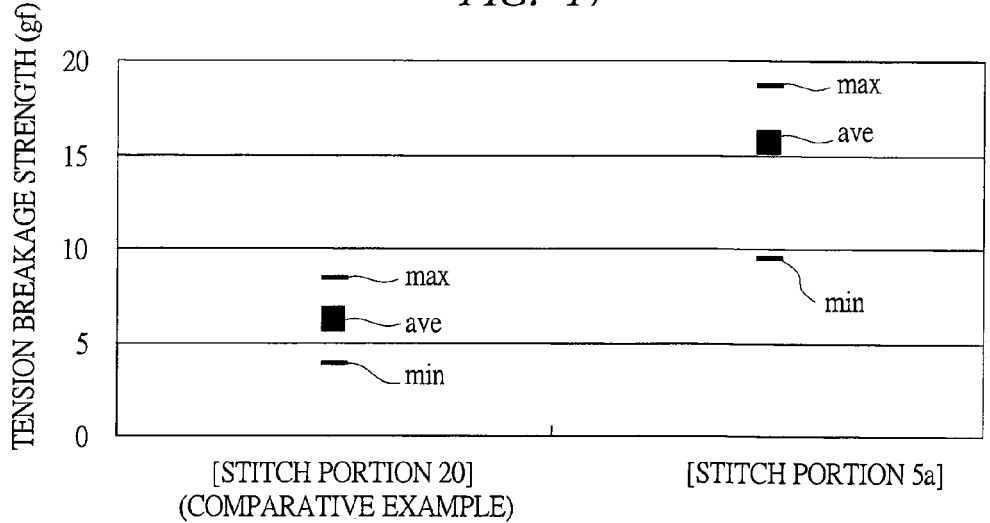
FIG. 17 is a result diagram illustrating an example of evaluation results when performing evaluations of tension breaking strength on the stitch shape of the first embodiment illustrated in FIG. 15 and the stitch shape of the comparative example illustrated in FIG. 16.
FIG. 18 is a result diagram illustrating number examples of the evaluation results of tension breaking strength illustrated in FIG. 17.
Figure 19:
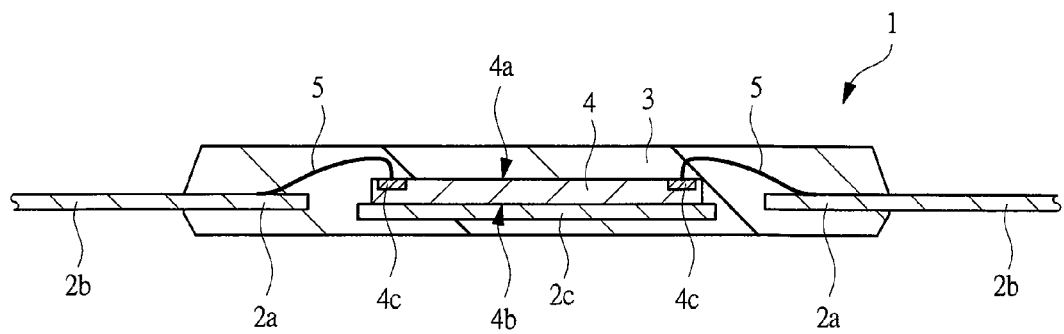
FIG. 19 is a partial cross-sectional view illustrating an example of a structure after resin molding in the assembly of the semiconductor device illustrated in FIG. 1.
Figure 20:
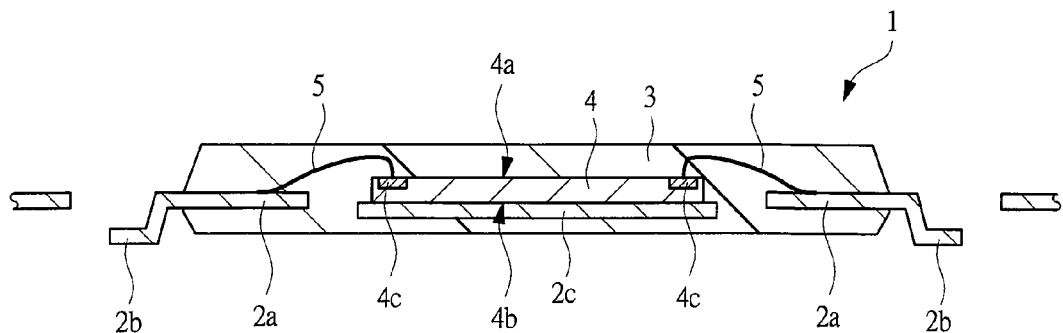
FIG. 20 is a partial cross-sectional view illustrating an example of a structure after cutting and shape-forming in the assembly of the semiconductor device illustrated in FIG. 1.

FIG. 3 is a manufacturing flowchart illustrating an example of an assembly procedure of the semiconductor device illustrated in FIG. 1, FIG. 4 is an enlarged partial plan view illustrating an example of a structure of a lead frame used in the assembly of the semiconductor device illustrated in FIG. 1, FIG. 5 is a partial cross-sectional view illustrating an example of a structure after a die bonding in the assembly of the semiconductor device illustrated in FIG. 1, and FIG. 6 is a partial cross-sectional view illustrating an example of a structure after a wire bonding of the assembly of the semiconductor device illustrated in FIG. 1. In addition, FIG. 7 is a configuration block diagram illustrating an example of a structure of a main part of a wire bonder used in a wire bonding process of the assembly of the semiconductor device illustrated in FIG. 1, FIG. 8 is a perspective view illustrating an example of a procedure until a looping in the wire bonding using the wire bonder illustrated in FIG. 7, and FIG. 9 is a perspective view illustrating an example of a procedure after a stitch bonding in the wire bonding using the wire bonder illustrated in FIG. 7. Further, FIG. 10 is an operational diagram illustrating an example of a trajectory of a capillary from a first bond to a second bond in the wire bonding using the wire bonder illustrated in FIG. 7, FIG. 11 is a control diagram illustrating an example of a control state of a height position of the capillary, load, and an ultrasonic wave in the wire bonding by the wire bonder illustrated in FIG. 7, FIG. 12 is an enlarged partial cross-sectional view illustrating an example of a structure upon landing detection and height control during the stitch bonding by the wire bonder illustrated in FIG. 7, and FIG. 13 is an enlarged partial cross-sectional view illustrating an example of a structure upon starting load control and ending the load control during the stitch bonding by the wire bonder illustrated in FIG. 7. Still further, FIG. 14 is an enlarged partial cross-sectional view illustrating an example of a shift amount of an ideal capillary during the stitch bonding by the wire bonder illustrated in FIG. 14, FIG. 15 is an enlarged partial cross-sectional view illustrating an example of a stitch shape when performing the stitch bonding by the wire bonder illustrated in FIG. 7, and FIG. 16 is an enlarged partial cross-sectional view illustrating a stitch shape of a comparative example. Moreover, FIG. 17 is a result diagram illustrating an example of evaluation results when performing evaluations of tension breaking strength on the stitch shape of the first embodiment illustrated in FIG. 15 and the stitch shape of the comparative example illustrated in FIG. 16, FIG. 18 is a result diagram illustrating number examples of the evaluation results of tension breaking strength illustrated in FIG. 17, FIG. 19 is a partial cross-sectional view illustrating an example of a structure after resin molding in the assembly of the semiconductor device illustrated in FIG. 1, and FIG. 20 is a partial cross-sectional view illustrating an example of a structure after cutting and shape-forming in the assembly of the semiconductor device illustrated in FIG. 1.

First, a lead frame preparation illustrated as a step 1 in FIG. 3 is performed. Here, a matrix frame 2 as an example of a lead frame illustrated in FIG. 4 is prepared. To the matrix frame 2, a plurality of device regions 2d to which the semiconductor device will be mounted are formed next to each other, and the plurality of the inner leads (leads) 2a and the outer leads 2b are provided to each of the device regions 2d.

To the matrix frame 2 illustrated in FIG. 4 used in the first embodiment, the plurality of pieces of the device regions 2d, which are regions for forming one QFP 1, are formed in a matrix arrangement for a plurality of lines×a plurality of columns (for example, 2 lines×2 columns in FIG. 4), and one tab (die pad) 2c, the plurality of inner leads 2a, the plurality of outer leads 2b etc. are formed to each of the device regions 2d.

Also, the matrix frame 2 is, for example, a rectangle thin-plate member formed of a copper alloy etc., and the tab 2c, the plurality of inner leads 2a and outer leads 2b are integrally formed in the matrix frame 2. In the matrix frame 2 illustrated in FIG. 4, the X direction is a longitudinal direction of the rectangle, and the Y direction is a width direction of the rectangle.

Moreover, a plurality of long holes 2g for positioning upon processing and a plurality of sprocket holes 2f for guidance are formed to frame portions 2e at both ends in the width direction of the matrix frame 2.

Note that, while the number of lines of the inner leads 2a in one of the device regions 2d in the matrix frame 2 illustrated in FIG. 4 is different from that of the outer leads 2b in the QFP 1 illustrated in FIG. 1, this is for facilitating understanding of the shape of the lead portion of the matrix frame 2 and it is needless to say that the number of the inner leads 2a in one device region 2d of the matrix frame 2 used for assembling the QFP 1 is the same as the number of the outer leads 2b of the QFP 1.

Thereafter, a die bonding illustrated as a step S2 in FIG. 3 is performed. Herein, the semiconductor chips 4 are mounted to the tabs (chip mounting portions) 2c in the plurality of device regions 2d of the matrix frame 2 via a die-bonding material as illustrated in FIG. 5. That is, a back surface 4b of the semiconductor chip 4 and the tab 2c are bonded by the die-bonding material.

Thereafter, a wire bonding illustrated as a step S3 in FIG. 3 is performed. That is, as illustrated in FIG. 6, the electrode pad 4c on the main surface 4a of the semiconductor chip 4 and the inner lead 2a corresponding to the electrode pad 4c are electrically connected by the wire 5 in accordance with a guide by a capillary 6e that is a bonding tool illustrated in FIG. 7. Note that the wire 5 is a copper line.

Here, a wire bonder 6 illustrated in FIG. 7 to be used in the wire bonding step of the step S3 will be described.

The wire bonder 6 includes, in its main part: a bonding head portion 6b which performs a wire binding; an XY table 6a which supports and moves the bonding head 6b in an XY direction; and a height control portion 6c which performs height control of the bonding head 6b.

Further, to the bonding head 6b, the capillary 6e which navigates the wire 5 upon wire bonding; a horn 6d which works with the height control portion 6c and to which the capillary 6e is attached; a tensioner 6h; a clamper 6g which nips the wire 5 when cutting the wire 5; and so forth.

Here, a procedure of the wire bonding in the assembly of the QFP 1 according to the first embodiment will be described with reference to FIGS. 8 and 9. Note that the wire bonding described in the first embodiment is a ball bonding.

First, a ball formation illustrated as a step S3-1 in FIG. 8 is performed. Here, after arranging the matrix frame 2 on a heat stage 6j, tips of the wires 5 navigated by the capillary 6e is discharged by a torch 6i to make the tips like a ball shape.

Thereafter, a ball bonding illustrated as a step S3-2 is performed on the chip side. Herein, a 1st bond for bonding the tip of the wire 5 in a ball shape with the electrode pad 4c of the semiconductor chip 4 by applying an ultrasonic wave and/or heat is performed.

Thereafter, a looping illustrated as a step S3-3 is performed. Herein, after forming a loop shape of the wire 5 is formed by the guidance of the capillary 6e, the wire 5 is arranged on the inner lead 2a.

Thereafter, a stitch bonding illustrated as a step S3-4 in FIG. 9 is performed on the inner lead side. Herein, a 2nd bond for bonding the wire 5 to the inner lead 2a by the guidance of the capillary 6e is performed by applying ultrasonic waves or heat.

Thereafter, a tail cut illustrated as a step S3-5 is performed. Herein, the wire 5 being nipped by the clamper 6g is pulled by the capillary 6e to break the wire 5.

Thereafter, the operation from the step S3-1 to step S3-5 is performed in the same manner to the other electrode pads 4c, and a process of a step S3-6 is finished.

Next, the stitch bonding in the wire bonding of the first embodiment will be described.

The stitch bonding according to the first embodiment relates to the 2nd bond to the inner leads 2a after performing the 1st bond to the electrode pads 4c of the semiconductor chip 4. FIG. 10 illustrates a trajectory of a tip of the capillary 6e from the 1st bond to the 2nd bond. You can see that the wire 5 is contacted with the inner lead 2a at the stitch bonding portion, i.e., the portion of the 2nd bond, and then the capillary 6e is gradually lowered and contacted with the inner lead 2a.

Further, FIG. 11 illustrates relations of a height position of the capillary 6e, wire bonding load, and a wire bonding ultrasonic wave with respect to time (t) from the 1st bond to the 2nd bond, respectively. That is, FIG. 11 is a diagram for understanding relations of a height position of the capillary 6e, load, and an ultrasonic wave with respect to time (t) at a stitch bonding portion (2nd bond portion).

As illustrated in FIG. 11, the stitch bonding of the first embodiment includes a height control step for controlling a height of the capillary 6e so that the capillary 6e presses the wire 5 in a stepwise fashion when connecting the wire 5 to the inner lead 2a between a first point "V" at which the wire 5 contacts the inner lead 2a and a second point "W" at which the capillary 6 contacts the inner lead 2a.

That is, after the 1st bond is finished, the looping is performed, and then the wire 5 is lowered in accordance with a guide of the capillary 6e, and the height control of the capillary 6e is performed when performing the 2nd bond on the inner lead 2a.

When performing the height control, in the stitch bonding that is the 2nd bond, a point where the wire 5 contacts the inner lead 2a is set as the first point V, and further, a point where the capillary 6e is lowered and contacts the inner lead 2a is set as the second point W, and the height control of the capillary 6e is performed between the first point V to the second point W.

In the height control of the capillary 6e, with monitoring a position in a height direction of the capillary 6e, load and/or an ultrasonic wave is applied to the wire 5 from the capillary 6e so that the position in the height direction of the capillary 6e lowered to press the wire 5 is controlled.

Note that, as a specific example of the height control of the capillary 6e, a height of a tip portion of the capillary 6e is monitored, and the load applied to the wire 5 from the capillary 6e is reduced when a lowering speed of the capillary 6e is larger than a setting value that has been previously set, and the load applied to the wire 5 from the capillary 6e is increased when the lowering speed of the capillary 6e is smaller than the set value.

More specifically, in the step of height control of the capillary 6e, the set value of the lowering speed of the capillary 6e (the gradient in the graph of the height control in FIG. 11) is previously calculated by an evaluation or simulation, and whether the lowering speed of the capillary 6e is larger or smaller than the set value is detected with taking the set value as a reference, and the stitch bonding is performed while feedback is being given so that the lowering speed becomes close to the setting value as much as possible.

Note that, in the height control of the capillary 6e, as illustrated in FIG. 11, an ultrasonic wave is applied to the wire 5 at the same time with applying load, and the height of the capillary 6e is controlled so that the capillary 6e presses the wire 5 in a stepwise fashion. Alternatively, the height position of the capillary 6e is controlled so that a thickness of the wire bonding portion (the stitch portion 5a of the wire 5 illustrated in FIG. 5) of the 2nd bond portion of the wire 5 become a desired thickness.

Also, as illustrated in FIG. 11, after the height control (after reaching the second point W), load control is performed. Here, after reaching the second point W, in addition to applying load to the wire 5 from the capillary 6e, an ultrasonic wave is applied. The capillary 6e is not moved in a horizontal direction in the load-control step, and a strength of the bond between the wire 5 and the inner lead 2a is increased by applying load and an ultrasonic wave to the wire at the second point W.

Here, detailed operation of the capillary 6e in the height control and load control will be described with reference to FIGS. 12 and 13. In this regard, an example of using the wire 5 having a diameter of 30 μm will be described.

As illustrated in FIG. 12 as "height control start," the height control of the capillary 6e is started from a point (first point V) at which the wire 5 contacts the inner lead 2a and the landing is detected. Herein, as described above, whether the lowering speed of the capillary 6e is larger or smaller than the setting value of the lowering speed of the capillary 6e, which has been preciously calculated, is detected with reference to the setting value and the stitch bonding is performed with giving feedback so that the lowering speed of the capillary 6e becomes close to the setting value as much as possible.

More specifically, as illustrated in FIG. 12 as "in the midst of height control," the height control of the capillary 6e is performed with giving feedback and the capillary 6e is pushed into the wire 5 in a stepwise fashion (little by little). In the operation, the horn 6d is driven in the height direction and the XY direction (horizontal direction) by the height control portion 6c.

Herein, it is preferable that a lowered amount (shift amount) in the height direction of the capillary 6e in the height control is the same as a diameter of the wire 5, and a shift amount in the XY direction (horizontal direction) of the capillary 6e is the same as the diameter of the wire 5.

Thereafter, height control end/load control start illustrated in FIG. 13 are performed. More specifically, the height control is ended at the point (second point W) at which the tip of the capillary 6e being lowered contacts the inner lead 2a, and then the load control is started. Note that a thickness of the stitch portion 5a of the wire 5 at the point of height control end (load control start point) is substantially zero.

Then, in the load control, the capillary 6e is not moved like described above and load and an ultrasonic wave are applied to the wire 5 from the capillary 6e while the capillary 6e is staying at the second point W. That is, the load and ultrasonic wave are applied to the wire 5 at an edge portion 6f of the capillary 6e.

Thereafter, as illustrated in FIG. 13 as "load control end," load and an ultrasonic wave are applied to the wire 5 from the capillary 6e for a predetermined time, and then the bonding ends.

Here, FIG. 14 illustrates an example of a state of ideal height control of the capillary 6e, wherein, when a diameter (E) of the wire 5 is 30 μm, a shift amount (F) in the horizontal direction of the tip of the capillary 6e in the height control is 30 μm, and a shift amount (G) in the height direction of the tip of the capillary 6e in the height control is also 30 μm, for example. In this case, the time of moving the capillary 6e in the height control is about 0.1 second.

Note that time of performing the load control after the height control of the capillary 6e is about 0.02 second.

Next, in FIGS. 17 and 18, the stitch portion 5a formed with the height control of the capillary 6e of the first embodiment (FIG. 15; thickness of the stitch portion is large) and a stitch portion 20 of a comparative example (FIG. 16; thickness of the stitch portion is small) are compared about tension breaking strength, where evaluation is made with respect to the plurality of wires 5 of copper lines. According to FIGS. 17 and 18, the value of tension breaking strength is higher in the stitch portion 5a of the first embodiment illustrated in FIG. 15 regarding all of MAX (maximum), AVE (average), and MIN (minimum), and it shows that the bonding strength is high even in the stitch bonding.

The wire bonding is sequentially performed in the above-described manner, and then the wire bonding step illustrated in the step S3 in FIG. 3 is finished.

After the wire bonding step is finished, the resin molding illustrated in the step S4 in FIG. 3 is performed. Herein, the tab 2c, the semiconductor chip 4, the plurality of inner leads 2a and the wires 5 illustrated in FIG. 19 in the device region 2d of the matrix frame 2 are resin-sealed using a resin mold not illustrated and a sealing resin, thereby forming the sealant 3. Note that the sealing resin is, for example, a thermosetting epoxy resin or the like.

Thereafter, cutting/shape-formation (curing) illustrated as the step S5 in FIG. 3 are performed. Herein, the matrix frame 2 is cut to be singulated in a unit of each package. In this case, as illustrated in FIG. 20, each of the plurality of outer leads 2b protruding from the sealant 3 are bent in a gull wing shape, and then the assembly of the QFP 1 is finished.

According to the method of manufacturing the semiconductor device of the first embodiment, by controlling the height of the tip of the capillary 6e in the stitch bonding that is the 2nd bond in the wire bonding, it is possible to perform a height control (thickness control of the stitch portion 5a) of the wire bonding portion and the thickness of the stitch portion 5a can be sufficiently ensured, and also, a smooth shape having no stress concentrating point in the stitch portion 5a can be formed.

As a result, a sufficient bonding strength is ensured in the wire bonding portion (stitch portion 5a) and an improvement in bonding reliability of the wires 5 in the stitch bonding can be achieved.

Further, since the thickness of the stitch portion 5a can be ensured in the stitch bonding, copper lines can be used in the wire bonding and a cost reduction of the wire bonding can be achieved. Also, since copper lines can be used, an electric conductivity of the wire 5 can be increased.

Also, since it is possible to perform the thickness control of the stitch portion 5a, it is possible to make the thickness of the wire bonding portion (stitch portion 5a) to a desired thickness. That is, the thickness of the wire bonding portion can be larger or smaller than the thickness of the stitch portion 5a.

Further, since it is possible to perform control of the thickness of the stitch portion 5a in the 2nd bond in the wire bonding, even when gold lines are further thinner when using gold lines as the wires 5, the bonding strength at the wire bonding portions can be increased.

Next, a modification example of the first embodiment will be described.

Figure 21:
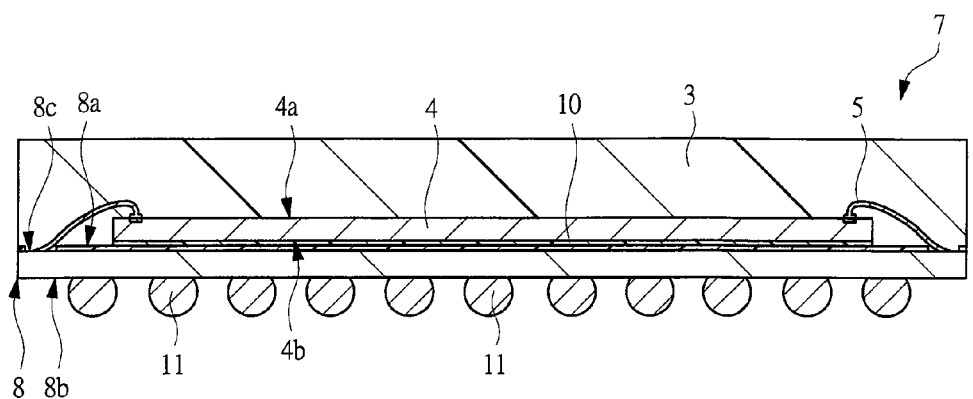
FIG. 21 is a cross-sectional view illustrating an example of a structure of a semiconductor device (BGA) according to a modification example of the present invention.
Figure 22:
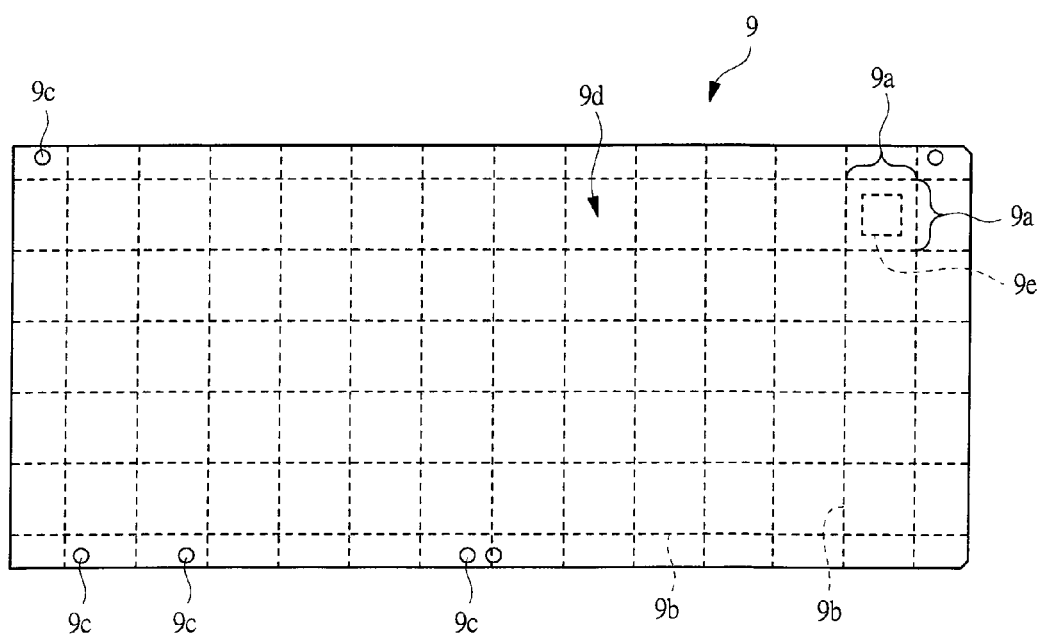
FIG. 22 is a plan view illustrating an example of a structure of a wiring board used in an assembly of the semiconductor device illustrated in FIG. 21.

FIG. 21 is a cross-sectional view illustrating an example of a structure of a semiconductor device (BGA) according to a modification example of the present invention, and FIG. 22 is a plan view illustrating an example of a structure of a wiring board used in an assembly of the semiconductor device illustrated in FIG. 21.

A BGA (ball grid array) 7 that is the semiconductor device illustrated in FIG. 21 includes the semiconductor chip 4 mounted on a main surface 8a of a BGA substrate (wiring board) 8 via a die bonding material such as a resin paste material 10. Surface electrodes of the semiconductor chip 4 and bonding leads 8c of the main surface 8a of the BGA substrate 8 are electrically connected by the plurality of wires 5. Further, the semiconductor chip 4 and the plurality of wires 5 are resin-sealed by the sealant 3 formed of a sealing resin.

Also, to a back surface 8b side of the BGA substrate 8, a plurality of solder balls to be external connection terminals are provided next to each other in a grid-like manner.

FIG. 22 illustrates a structure of a multi-piece substrate (wiring board) 9 used in an assembly of the BGA 7 having such a structure. On a main surface 9d of the multi-piece substrate 9, a plurality of device regions 9a which are regions where one BGA 7 can be assembled are formed in a matrix array. Each of the device regions 9a are sectioned by dicing lines 9b, and a chip mounting portion 9e which is a region for mounting the semiconductor chip 4 is formed in each of the device regions 9a. Note that, on an outer periphery portion of a main surface 9d of the multi-piece substrate 9, a plurality of through-holes 9c used for positioning or guide in transfer of the substrate etc. are formed.

Also in the BGA 7 assembled by performing a wire bonding using such a multi-piece substrate 9, by controlling the height of the tip of the capillary 6e in the stitch bonding that is the 2nd bond in the wire bonding, it is possible to perform height control (thickness control of the stitch portion 5a) of the height of the wire bonding portion, and thus the thickness of the stitch portion 5a is sufficiently ensured, and also a smooth shape having no stress concentrated point in the stitch portion 5a can be formed.

As a result, an improvement in bonding reliability of the wires 5 in the stitch bonding can be achieved with ensuring a sufficient bonding strength at the wire bonding portions (stitch portions 5a).

Note that the other method of manufacturing the BGA 7 illustrated in FIG. 21 is the same as the method of manufacturing the QFP 1 illustrated in FIG. 1, and thus repetitive descriptions thereof will be omitted.

Also, other effects obtained according to the method of manufacturing the BGA 7 illustrated in FIG. 7 are the same as other effects obtained by the method of manufacturing the QFP 1 illustrated in FIG. 1, and thus repetitive description thereof will be omitted.

Second Embodiment

Figure 23:
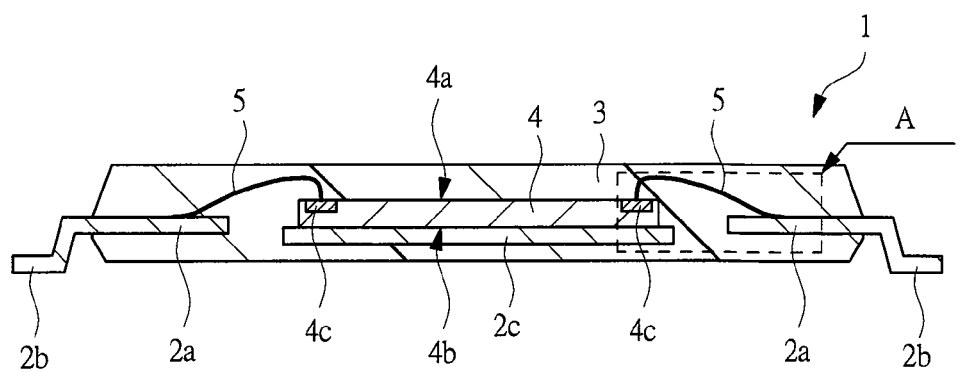
FIG. 23 is a cross-sectional view illustrating an example of a structure of a semiconductor device according to a second embodiment of present invention.
Figure 24:
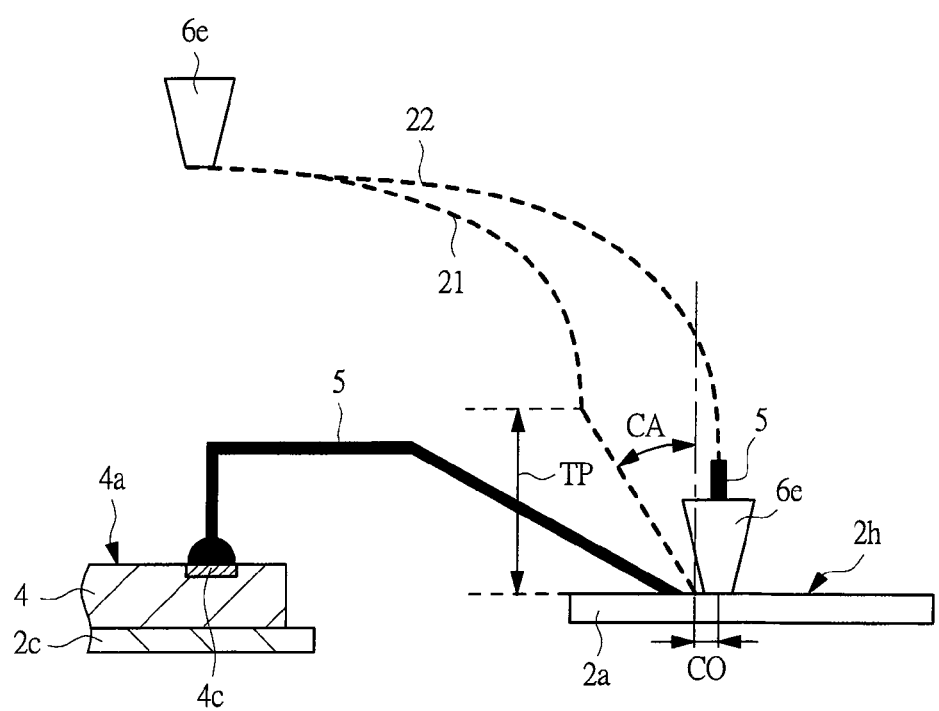
FIG. 24 is an operational diagram illustrating an example of a trajectory of a capillary after a first bond until a second bond in a wire bonding of an A portion in an assembly of the semiconductor device illustrated in FIG. 23.
Figure 25:
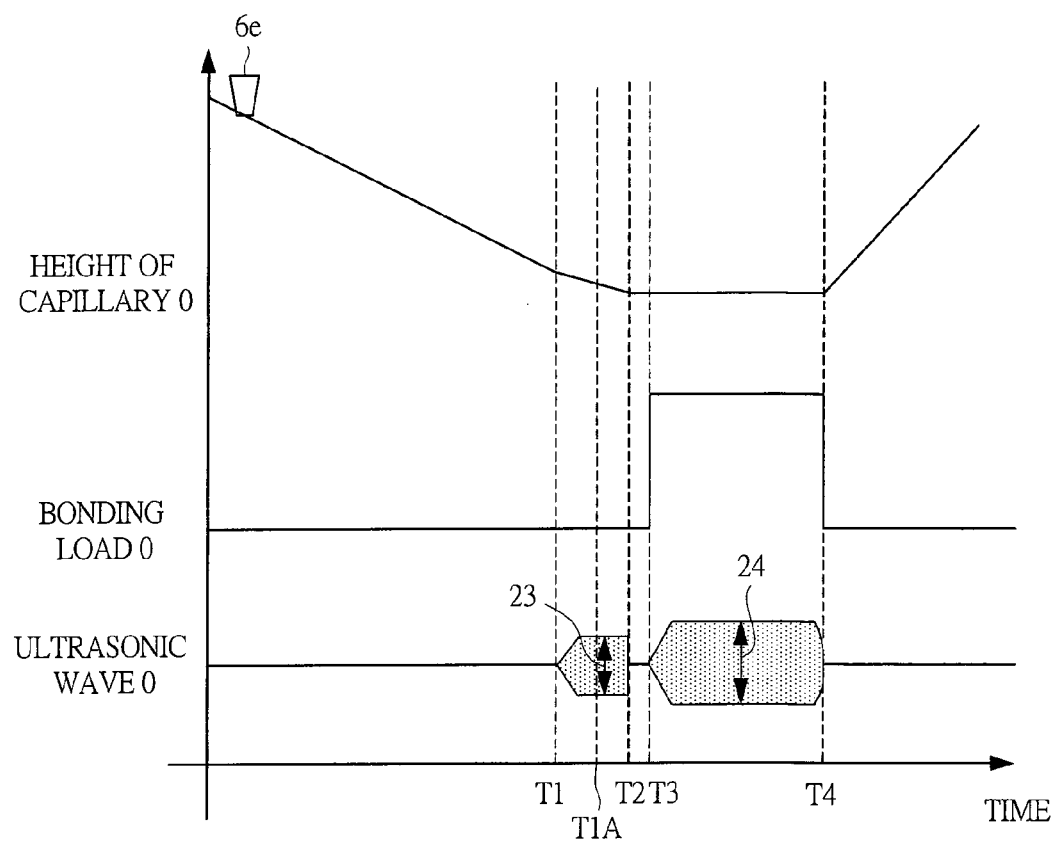
FIG. 25 is a time chart illustrating an example of a height of the capillary, bonding load, and ultrasonic waves in the wire bonding illustrated in FIG. 24.
Figure 26:
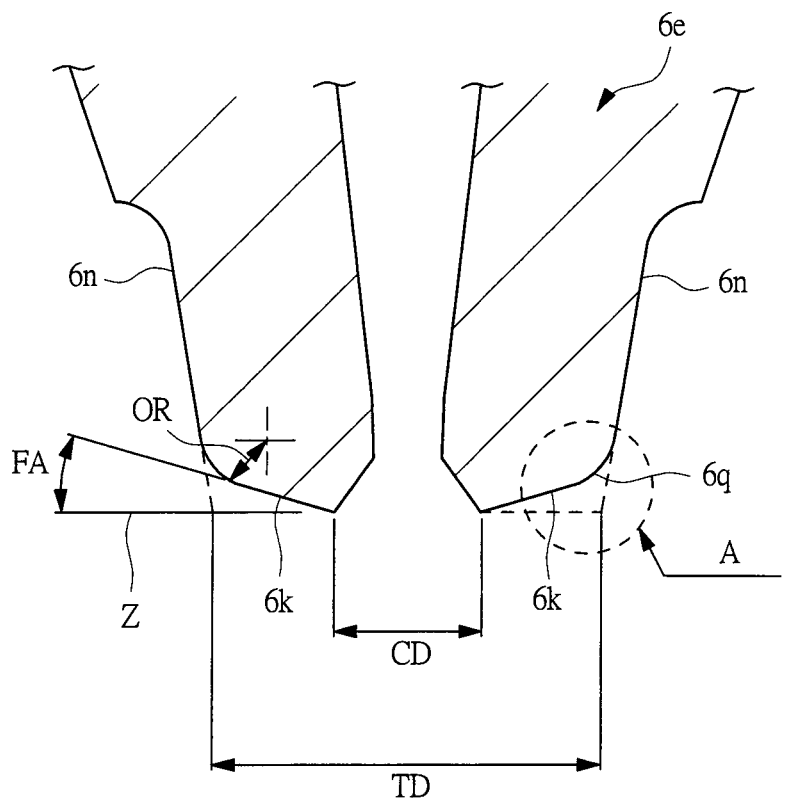
FIG. 26 is a partial cross-sectional view illustrating an example of a structure of a tip portion of the capillary used in the wire bonding in the assembly of the semiconductor device illustrated in FIG. 23.
Figure 27:
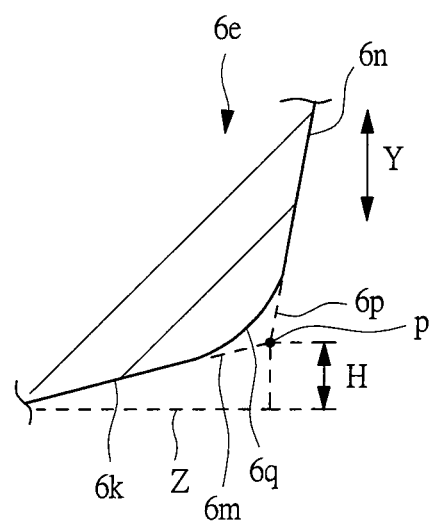
FIG. 27 is an enlarged partial cross-sectional view illustrating an example of a structure of an A portion illustrated in FIG. 26.
Figure 28:
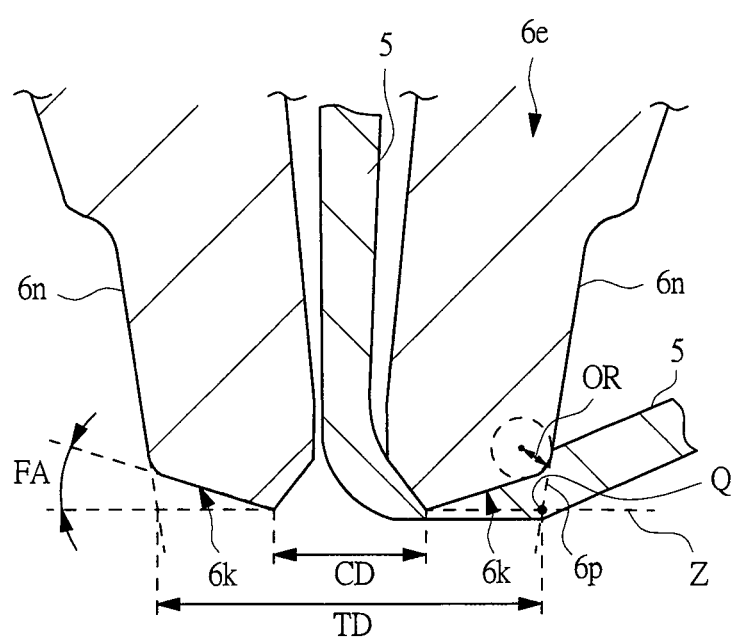
FIG. 28 is a partial cross-sectional view illustrating an example of a state of a wire upon bonding by the capillary illustrated in FIG. 26.
Figure 29:
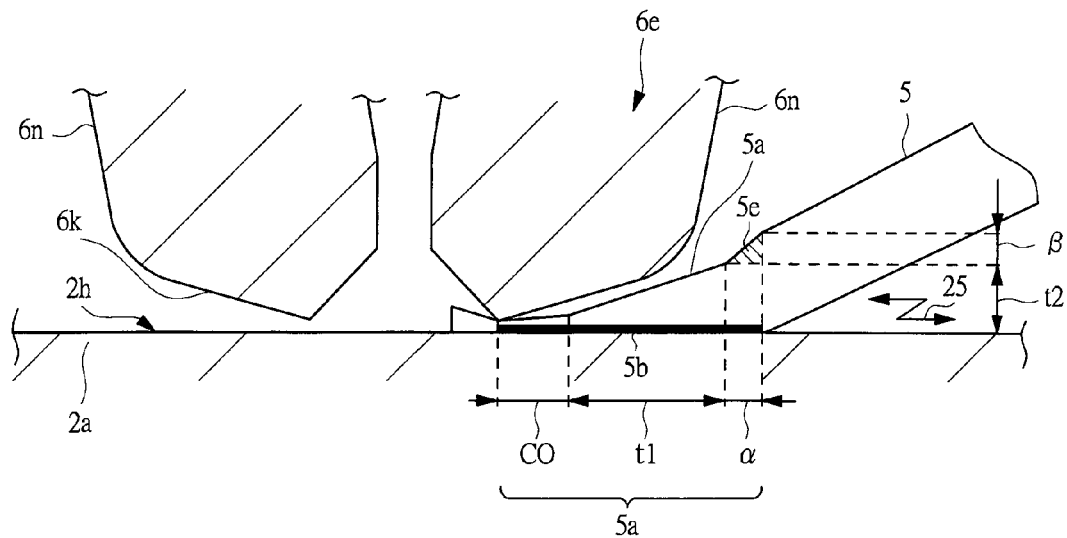
FIG. 29 is a partial cross-sectional view illustrating an example of a stitch shape upon the wire bonding illustrated in FIG. 28.
Figure 30:
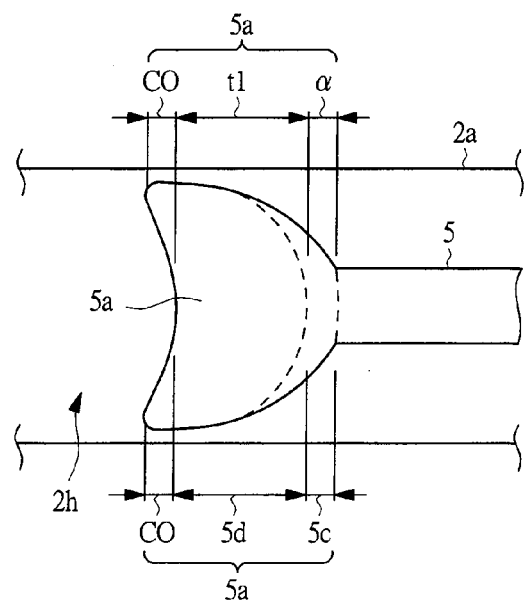
FIG. 30 is a partial plan view illustrating an example of a stitch shape of a wire bonding portion illustrated in FIG. 29.
Figure 31:
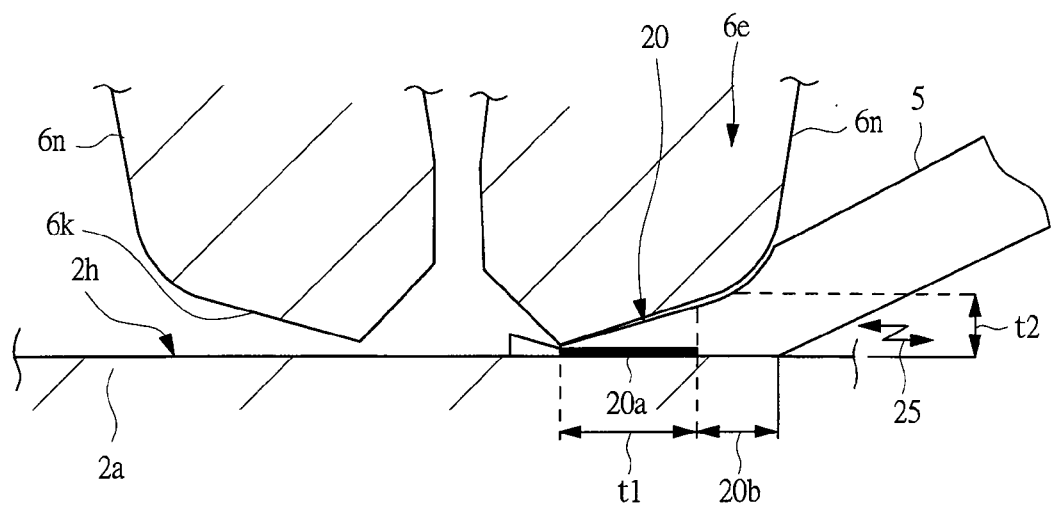
FIG. 31 is a partial cross-sectional view illustrating a stitch shape upon wire bonding according to a comparative example.
Figure 32:
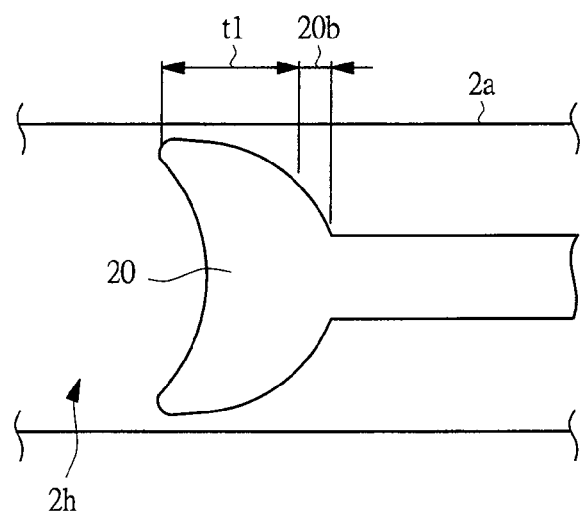
FIG. 32 is a partial plan view illustrating the stitch shape illustrated in FIG. 31.

FIG. 23 is a cross-sectional view illustrating an example of a structure of a semiconductor device according to a second embodiment of the present invention, FIG. 24 is an operational diagram illustrating an example of a trajectory of a capillary after a first bond until a second bond in a wire bonding of an "A" portion in an assembly of the semiconductor device illustrated in FIG. 23, and FIG. 25 is a time chart illustrating an example of a height of the capillary, bonding load, and ultrasonic waves in the wire bonding illustrated in FIG. 24. Further, FIG. 26 is a partial cross-sectional view illustrating an example of a structure of a tip portion of the capillary used in the wire bonding in an assembly of the semiconductor device illustrated in FIG. 23, FIG. 27 is an enlarged partial cross-sectional view illustrating an example of a structure of an A portion illustrated in FIG. 26, FIG. 28 is a partial cross-sectional view illustrating an example of a state of a wire upon bonding by the capillary illustrated in FIG. 26, FIG. 29 is a partial cross-sectional view illustrating an example of a stitch shape upon the wire bonding illustrated in FIG. 28, FIG. 30 is a partial plan view illustrating an example of a stitch shape of the wire bonding portion illustrated in FIG. 29. Moreover, FIG. 31 is a partial cross-sectional view illustrating a stitch shape upon wire bonding according to a comparative example, and FIG. 32 is a partial plan view illustrating the stitch shape illustrated in FIG. 31.

In the second embodiment, control of the capillary 6e in the method of wire bonding described in the first embodiment (height control+load control) will be described in further details, and also, an example of a structure of a semiconductor device (QFP 1) assembled by performing wire bonding using the control of the capillary 6e will be described.

First, the QFP 1 according to the second embodiment illustrated in FIG. 23 has totally the same structure as that of the QFP 1 according to the first embodiment illustrated in FIGS. 1 and 2. The QFP 1 includes: a semiconductor chip 4 to which a semiconductor integrated circuit is formed; a plurality of inner leads 2a radially arranged around the semiconductor chip 4; a plurality of outer leads 2b formed integrally with the inner leads 2a; and a plurality of wires 5 which electrically connect electrode pads 4c formed to a main surface of the semiconductor chip 4 and the inner leads 2a corresponding to the electrode pads 4c.

Further, the semiconductor chip 4, the plurality of inner leads 2a, and the plurality of wires 5 are resin-sealed by a sealant 3. In addition, each of the plurality of outer leads 2b exposed from the sealant 3 is bent and formed in a gull wing shape.

Note that the wire 5 is, for example, a copper wire, but a gold wire or others can be used.

Next, operation and control of the capillary 6e in a wire bonding in an assembly of the semiconductor device according to the second embodiment will be described.

FIG. 24 illustrates a trajectory of a movement of the capillary 6e upon a wire bonding at an "A" portion in the QFP 1 illustrated in FIG. 23, and mainly illustrates a trajectory of the capillary 6e from after ending of a 1st bond (chip side bonding) to a 2nd bond (lead side bond) point. In FIG. 24, a capillary trajectory 21 is a trajectory of the second embodiment, and a capillary trajectory 22 is a trajectory of a general capillary 6e which has been studied as a comparative example by the inventors of the present invention.

Further, in FIG. 24, TP (tip) denotes a height of the capillary 6e at a point where the capillary 6e being lowered at a high speed from a pinnacle of the loop trajectory of the capillary 6e is switched to a constant speed. CA (contact angle) denotes a lowering angle of the capillary 6e when the capillary 6e lands on a bonding surface 2h of the inner lead 2a from the TP of the 2nd bond. Further, CO (contact offset) denotes a distance of sliding the capillary 6e after the capillary 6e lands on the bonding surface 2h of the inner lead 2a.

In the capillary trajectory 22 of the comparative example, CA that is a lowering angle of the capillary 6e in the 2nd bond is 0° (degree). That is, upon the 2nd bond, the capillary 6e is lowered from substantially right above with respect to the landing point of the bonding surface 2h of the inner lead 2a, and lands at the 2nd bond point.

Meanwhile, regarding the capillary trajectory 21 of the second embodiment, CA is 9° (degrees), for example, and in this case, TP is 0.127 mm (5 mils), and CO is 0.0381 mm (1.5 mils). That is, in the capillary trajectory 21 of the second embodiment, the capillary 6e is lowered at a constant speed being tilted at a lowering angle of 9° with respect to the bonding surface 2h of the inner lead 2a upon the 2nd bond and landed on the 2nd bond point, and then slid for 0.0381 mm. This is because the height control of the capillary 6e is performed before the capillary 6e is landed on the inner lead 2a upon the 2nd bond as described in the first embodiment, and to perform the height control. The capillary 6e is lowered at a constant speed being tilted just before the wire 5 contacts the inner lead 2a, and the height control of the capillary 6e is started at a point when the wire 5 contacts the inner lead 2a. Note that the method of controlling of the height control of the capillary 6e itself is the same as that described in the first embodiment.

Further, the numbers of above-mentioned CA, TP, CO are just examples, and they are not limited to those numbers.

In addition, also in the wire bonding of the second embodiment, load control of the capillary 6e is performed in the same manner as that described in the first embodiment upon the 2nd bond.

That is, as illustrated in the time chart in FIG. 25, as well as starting a tilted lowering of the capillary 6e at a time T1, application of a first ultrasonic wave that is a pre-landing ultrasonic wave and also is an ultrasonic wave having a first amplitude is started. When an amplitude of the first ultrasonic wave is taken as a first amplitude 23, an input value in the wire bonder for forming the first amplitude is, for example, 60 mA.

Thereafter, when a point when the wire 5 contacts the inner lead 2a is taken as T1A, the height control of the capillary 6e described in the first embodiment is started at the time T1A. The height control of the capillary 6e controls the height of the capillary 6e so that the capillary 6e presses the wire 5 in a stepwise fashion.

Thereafter, when a point when the capillary 6e contacts the bonding surface 2h of the inner lead 2a is taken as T2A, the height control of the capillary 6e is ended at the time T2A.

That is, while the height performance of the capillary 6e is performed, the first ultrasonic wave having the first amplitude is applied to the wire 5.

Thereafter, the load control of the capillary 6e is started at a time T3. Note that an ultrasonic wave is also applied in the load control. The ultrasonic wave applied in the load control is a second ultrasonic wave having second amplitude that is larger than the first amplitude of the first ultrasonic wave. When amplitude of the second ultrasonic wave is taken as second amplitude 24, an input value of the wire bonder for forming the second amplitude 24 is, for example, 75 mA. That is, there is a relation of (the first ultrasonic wave of the first amplitude)<(the second ultrasonic wave of the second amplitude 24).

Therefore, in the height control step of the capillary 6e, the first ultrasonic wave of the first amplitude 23 is applied to the wire 5, and further, in the load-control step after the height control step, the second ultrasonic wave of the second amplitude 24 that is larger than the first amplitude is applied to the wire 5.

In other words, in the height control step of the capillary 6e, the first ultrasonic wave having smaller energy than the second ultrasonic wave that is applied in the load-control step is applied.

Since load is not applied to the wire 5 in the height control of the second embodiment, wire cutting is prone to occur when excessive energy is transferred to the wire when a large ultrasonic wave is applied without applying load to the wire because the wire is not held. Therefore, the ultrasonic wave having relatively small energy (amplitude) is applied not to cause the wire cutting.

Note that amplitude of the first ultrasonic wave (first amplitude) in the second embodiment is preferable to be, for example, 30 to 80% of amplitude of the second ultrasonic wave (second amplitude). Herein, the magnitude of the energy of the ultrasonic wave is determined mainly according to the amplitude of the amplification and application time.

Thereafter, the load control is ended at a time T4, and the 2nd bond for bonding the wire 5 and the inner lead 2a is finished.

Next, a feature portion of the structure of the QFP 1 which is assembled with using the method of controlling the capillary 6e in the wire bonding according to the second embodiment will be described.

First, with reference to FIGS. 26 to 28, a shape of the tip of the capillary 6e will be described. "CD" (chamfer diameter) illustrated in FIGS. 6 and 28 is a diameter of an opening at the very tip of the capillary 6e, and "FA" (face angle) is an angle between a horizontal plane Z and a face plane 6k of the capillary 6e. In addition, "OR" (outside radius) is a radius of a circle forming a curve portion 6q connecting the face plane 6k and a neck side plane 6n, and "TD" (tip diameter) is a diameter of a virtual circle in the capillary's outer periphery direction formed by an extension line 6p of the neck side plane 6n and a crossing point Q.

Further, a height H illustrated in FIG. 27 denotes a height in a perpendicular direction Y of a crossing point P of extension lines 6m and 6p of the face plane 6k and the neck side plane 6n of the capillary 6e, respectively.

Herein, regarding the 2nd bond, FIGS. 29 and 30 illustrate a structure of the stitch portion (wire bonding portion) 5a upon performing a wire bonding using the control of the capillary 6e (operation of the capillary 6e illustrated in FIGS. 24 and 25) of the second embodiment using the capillary 6e having the shape illustrated in FIGS. 26 to 28. In addition, FIGS. 31 and 32 illustrate a structure of the stitch portion 20 upon performing the 2nd bond by the operation of the capillary trajectory 22 of the comparative example in FIG. 24 which the inventors of the present invention have been studied.

A length t1 in the stitch portion 20 in FIGS. 31 and 32 denotes a length of a bonding region 20a of a stitch portion 20 in a wiring direction 25 in the case where CA (contact angle) that is the lowering angle of the capillary 6e upon landing to the 2nd bond point is CA=0° (degree). Also, a thickness (MAX) of the stitch portion 20 in the case is taken as t2.

Herein, the length t1 of the stitch portion 20 is expressed by t1=(TD−CD)/2−OR based on the shape of the capillary 6e illustrated in FIG. 28. The thickness t2 of the stitch portion 20 is expressed by t2=t1×tan(FA)=t1(TD−CD)/2−t1×OR.

In addition, the thickness t2 of the stitch portion 20 is the same as the height H in the perpendicular direction Y of the crossing point P illustrated in FIG. 27.

Note that, while the thick solid line illustrates the bonding region 20a in the stitch portion 20 of the comparative example in FIG. 31, the stitch portion 20 has a non-bonding region 20b which is not actually bonded while it seems to be apparently bonded because the stitch portion 20 is pressed from above by the capillary 6e.

Meanwhile, a length of the bonding region 5b (thick solid line portion) of the stitch portion (wire bonding portion) 5a in FIG. 29 when the wire bonding is performed using the control of the capillary 6e of the second embodiment is expressed by CO (contact offset)+t1+α. That is, the stitch portion 5a is a wire bonding portion including (CO+t1+α) and a thick portion 5e. Herein, the region denoted by "α" is a region bonded by the ultrasonic wave (the first ultrasonic wave of the first amplitude) before the capillary 6e lands. In other words, the region denoted by α is a region in which bond is increased in the horizontal direction as the height of the capillary 6e is controlled before landing.

Further, the thickness (MAX) of the stitch portion 5a can be expressed by β+t2. Herein, the region denoted by "β" is a region in which the thickness is increased in the thickness direction by the ultrasonic wave (the first ultrasonic wave of the first amplitude) before the capillary 6e lands. In other words, the region denoted by β is a region in which bond is increased in the thickness direction as the height of the capillary 6e is controlled before landing, and is the thick portion 5e illustrated by the shaded area of the stitch portion 5a in FIG. 29.

Therefore, the 2nd bond portion (stitch portion 5a in FIG. 29) of the wire 5 in the QFP 1 illustrated in FIG. 23 assembled with performing the wire bonding using the control of the capillary 6e of the second embodiment has the thick portion 5e illustrated in FIG. 29 that is thicker than the height H in the perpendicular direction Y of the crossing point P of the extension lines 6m and 6p of the face plane 6k and the neck side plane 6n, respectively, of the capillary 6e in FIG. 28, and also, a part (α portion) of the bonding region 5b of the wire 5 and the inner lead 2a is formed to a lower portion of the thick portion 5e.

Also, in the stitch portion 5a illustrated in FIG. 29, a region in which a bond is made by applying the first ultrasonic wave having the first amplitude in the height control step of the capillary 6e is taken as a first bond region 5c illustrated in FIG. 30, and a region in which a bond is made by applying the second ultrasonic wave having the second amplitude that is larger than the first amplitude of the first amplitude in the load-control step is taken as a second bond region 5d. Thus, the stitch portion 5a has the first bond region 5c formed by applying the first ultrasonic wave and the second bond region 5d formed by applying the second ultrasonic wave.

In this manner, when comparing the stitch portion 5a of the second embodiment illustrated in FIGS. 29 and 30 and the stitch portion 20 of the comparative example illustrated in FIGS. 31 and 32, the bonding region 5b of the stitch portion 5a has a larger bonding area than the bonding region 20a (thick solid line portion) of the stitch portion 20, and the stitch portion 5a has a thickness (MAX) larger than that of the stitch portion 20.

More specifically, in the QFP 1 of the second embodiment, the stitch portion (wire bonding portion) 5a of the 2nd bond portion of the wire 5 has the thick portion 5e, and the wire 5 and the part (α portion) of the bonding region 5b of the inner lead 2a are formed to a lower portion of the thick portion 5e, thereby sufficiently ensuring the thickness of the stitch portion 5a and also increasing the area of the bonding region 5b of the stitch portion 5a.

In this manner, wire cutting can be reduced by ensuring a sufficient bonding strength at the stitch portion 5a, and as a result, an improvement in a bonding reliability of the wire 5 in the stitch bonding can be achieved.

Also, in the height control step of the capillary 6e in the 2nd bond of the wire bonding according to the second embodiment, the first ultrasonic wave having smaller energy than the second ultrasonic wave that is applied in the load-control step is applied.

In this manner, occurrence of wire cutting due to a transfer of excessive energy of the ultrasonic wave to the wire itself can be reduced.

More specifically, since load is not applied to the wire 5 in the height control step of the capillary 6e, when a large ultrasonic wave is applied while load is not applied to the wire, wire cutting is caused because excessive energy is transferred to the wire itself as the wire is not held.

Accordingly, in the second embodiment, ultrasonic wave (first ultrasonic wave) having smaller energy (amplitude)

than the second ultrasonic wave applied in the load-control step is applied in the height control step of the capillary 6e and thus occurrence of wire cutting can be reduced.

As a result, an improvement in bonding reliability of the wire 5 in the stitch bonding can be achieved.

In addition, as the thickness of the stitch portion 5a can be ensured in the stitch bonding, it is possible to use copper lines in the wire bonding and thus a cost reduction in wire bonding can be achieved. Also, as the copper lines can be used, it is possible to increase the conductivity of the wires 5.

Note that the other structure of the semiconductor device of the second embodiment and the other method of manufacturing the same are the same as those of the semiconductor device described in the first embodiment, repetitive descriptions thereof will be omitted.

Moreover, since the other effects obtained by the method of manufacturing a semiconductor device and the semiconductor device of the second embodiment are the same as those described in the first embodiment, repetitive descriptions thereof will be omitted.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, while the method of manufacturing the QFP 1 of the first embodiment has been described regarding the case of using the matrix frame 2 as the lead frame, the lead frame may be a single column of lead frame capable of forming a plurality of the QFPs 1. Also, in the method of manufacturing the BGA 7, a single column of the multi-piece substrate 9 may be used.

Further, the semiconductor device may be a QFN (quad flat non-leaded package), SOP (small outline package), an LGA (land grid array) or the like other than the QFP 1 or BGA 7 as long as the semiconductor device is a semiconductor package being able to be assembled by performing wire bonding. The semiconductor device is applicable to all semiconductor packages assembled by performing wire bonding.

Also, while the case of not applying load to the capillary 6e in the height control step has been described in the second embodiment, load may be applied to the capillary 6e in the height control step as described in the first embodiment.

In addition, the first embodiment and the second embodiment may be independent technologies, or the first and second embodiments may be combined.

Moreover, at the stitch portion 5a which is a bonding portion of the lead (the inner lead 2a or the bonding lead 8c) and the wire 5 of the first and second embodiments, a bonding layer of the wire 5 and a plating of the lead are formed in the bonding region 5b of the stitch portion 5a.

For example, when the wire 5 is a copper (Cu) line and the plating on the lead is a palladium (Pd) plating, the bonding layer is Pd—Cu, and is Ag—Cu when the combination is between copper line and silver (Ag) plating, and is Ag—Au when the combination is between gold line and silver plating. Further, also regarding the semiconductor package using a substrate, Au—Au is formed when the combination is between gold line and gold plating.

The present invention is suitable in assembly of electronic devices in which wire bonding is performed.

What is claimed is:

1. A method of manufacturing a semiconductor device comprising the steps of:
   (a) preparing a lead frame including a chip mounting portion to which a semiconductor chip is mounted and a plurality of leads arranged around the chip mounting portion;
   (b) mounting the semiconductor chip to the chip mounting portion of the lead frame; and
   (c) connecting an electrode pad of the semiconductor chip and the lead corresponding to the electrode pad by a wire in accordance with a guide by a capillary,
   wherein the step (c) includes a height control step of controlling a height of the capillary so that the capillary presses the wire in a stepwise fashion from a first point where the wire contacts the lead to a second point where the capillary contacts the lead when connecting the wire to the lead, and a height of a tip portion of the capillary is monitored, and a magnitude of load to be applied to the wire from the capillary is decreased when a lowering speed of the capillary is larger than a setting value, and the load to be applied to the wire from the capillary is increased when the lowering speed of the capillary is smaller than the setting value.

2. The method of manufacturing a semiconductor device according to claim 1, wherein
   the wire is a copper line.

3. The method of manufacturing a semiconductor device according to claim 1, wherein
   the step (c) includes a load-control step of applying load to the wire from the capillary after the height control step.

4. The method of manufacturing a semiconductor device according to claim 2, wherein
   an ultrasonic wave is applied to the wire in the step (c).

5. The method of manufacturing a semiconductor device according to claim 4, wherein
   a shift amount in a height direction of the capillary in the height control step is the same as a diameter of the wire.

6. The method of manufacturing a semiconductor device according to claim 5, wherein
   a shift amount in a horizontal direction of the capillary in the height control step is the same as a diameter of the wire.

7. The method of manufacturing a semiconductor device according to claim 3, wherein
   the load is applied to the wire without shifting the capillary in a horizontal direction in the load-control step.

8. A method of manufacturing a semiconductor device comprising the steps of:
   (a) preparing a wiring board including a chip mounting portion to which a semiconductor chip is mounted and a plurality of bonding leads arranged around the chip mounting portion;
   (b) mounting the semiconductor chip to the chip mounting portion of the wiring board; and
   (c) connecting an electrode pad of the semiconductor chip and the bonding lead corresponding to the electrode pad by a wire in accordance with a guide by a capillary,
   wherein the step (c) includes a height control step of controlling a height of the capillary so that the capillary presses the wire in a stepwise fashion from a first point where the wire contacts the bonding lead to a second point where the capillary contacts the bonding lead when connecting the wire to the lead, and a height of a tip portion of the capillary is monitored, and a magnitude of load to be applied to the wire from the capillary is decreased when a lowering speed of the capillary is larger than a setting value, and the load to be applied to the wire from the capillary is increased when the lowering speed of the capillary is smaller than the setting value.

9. The method of manufacturing a semiconductor device according to claim 8, wherein
the wire is a copper line.

10. The method of manufacturing a semiconductor device according to claim 8, wherein
the step (c) includes a load-control step of applying load to the wire from the capillary after the height control step.

11. A method of manufacturing a semiconductor device comprising the steps of:
(a) preparing a lead frame including a chip mounting portion to which a semiconductor chip is mounted and a plurality of bonding leads arranged around the chip mounting portion;
(b) mounting the semiconductor chip to the chip mounting portion of the lead frame; and
(c) connecting an electrode pad of the semiconductor chip and the lead corresponding to the electrode pad by a wire in accordance with a guide by a capillary,
wherein the step (c) includes:
a height control step of controlling a height of the capillary so that the capillary presses the wire in a stepwise fashion from a first point where the wire contacts the lead to a second point where the capillary contacts the lead when connecting the wire to the lead; and
a load-control step of applying a load to the wire from the capillary after the height control step, and
wherein a first ultrasonic wave is applied to the wire in the height control step, and a second ultrasonic wave larger than the first ultrasonic wave is applied to the wire in the load-control step.

12. The method of manufacturing a semiconductor device according to claim 11, wherein
the wire is a copper line.

13. The method of manufacturing a semiconductor device according to claim 12, wherein
an amplitude of the first ultrasonic wave is 30 to 80% of that of the second ultrasonic wave.

14. A semiconductor device assembled by performing a wire bonding using a capillary, the semiconductor device comprising:
a chip mounting portion to which a semiconductor chip is mounted;
a plurality of leads arranged around the chip mounting portion; and
a plurality of wires which electrically connect a plurality of electrode pads formed on the semiconductor chip and the plurality of leads corresponding to the plurality of electrode pads, respectively,
wherein each of wire-bonding portions of the plurality of wires and the plurality of leads has a thick portion having a thickness larger than a height in a vertical direction of a crossing point of extended lines of a face surface and a neck side surface of the capillary, and
a bonding region of the wire and the lead is formed at a lower portion of the thick portion.

15. The semiconductor device according to claim 14, wherein
the wire is a copper line.

16. A semiconductor device assembled by performing a wire bonding using a capillary, the semiconductor device comprising:
a chip mounting portion to which a semiconductor chip is mounted;
a plurality of leads arranged around the chip mounting portion; and
a plurality of wires which electrically connect a plurality of electrode pads formed to the semiconductor chip and the plurality of leads corresponding to the plurality of electrode pads, respectively,
wherein each of wire bonding portions of the plurality of wires and the plurality of leads has a first bond region formed by applying a first ultrasonic wave having a first amplitude and a second bond region formed by applying a second ultrasonic wave having a second amplitude that is larger than the first amplitude.

17. The semiconductor device according to claim 16, wherein
the wire is a copper line.

18. The semiconductor device according to claim 17, wherein
the amplitude of the first ultrasonic wave is 30 to 80% of that of the second ultrasonic wave.

* * * * *